(12) United States Patent
Park et al.

(10) Patent No.: US 10,910,582 B2
(45) Date of Patent: Feb. 2, 2021

(54) LIGHT EMITTING DISPLAY DEVICE AND METHOD FOR FABRICATING THE SAME

(71) Applicant: SAMSUNG DISPLAY CO., LTD., Yongin-si (KR)

(72) Inventors: Gwuihyun Park, Yongin-si (KR); Pilsoon Hong, Yongin-si (KR); Chulwon Park, Yongin-si (KR); Bogeon Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 15/962,088

(22) Filed: Apr. 25, 2018

(65) Prior Publication Data

US 2019/0103575 A1   Apr. 4, 2019

(30) Foreign Application Priority Data

Sep. 29, 2017   (KR) .................. 10-2017-0127619

(51) Int. Cl.
| | | |
|---|---|---|
| H01L 51/50 | (2006.01) | |
| H01L 27/32 | (2006.01) | |
| H01L 51/56 | (2006.01) | |
| H01L 51/52 | (2006.01) | |
| H01L 27/12 | (2006.01) | |

(52) U.S. Cl.
CPC ...... *H01L 51/5088* (2013.01); *H01L 27/1225* (2013.01); *H01L 27/1255* (2013.01); *H01L 27/3262* (2013.01); *H01L 27/3272* (2013.01); *H01L 51/5096* (2013.01); *H01L 51/5209* (2013.01); *H01L 51/56* (2013.01); *H01L 27/124* (2013.01); *H01L 27/3211* (2013.01); *H01L 27/3248* (2013.01); *H01L 27/3276* (2013.01); *H01L 2227/323* (2013.01); *H01L 2251/303* (2013.01); *H01L 2251/558* (2013.01)

(58) Field of Classification Search
CPC ............. H01L 51/5088; H01L 51/5096; H01L 51/5209; H01L 51/56; H01L 27/3272; H01L 27/3262; H01L 2251/558; H01L 27/3248; H01L 27/3211; H01L 27/3276; H01L 2227/323; H01L 27/124; H01L 2251/303
See application file for complete search history.

(56) References Cited

U.S. PATENT DOCUMENTS

| | | |
|---|---|---|
| 8,334,168 B2 | 12/2012 | Cho et al. |
| 9,837,631 B2 | 12/2017 | Kim et al. |

(Continued)

FOREIGN PATENT DOCUMENTS

| | | |
|---|---|---|
| KR | 10-0659757 B1 | 12/2006 |
| KR | 10-2011-0095114 A | 8/2011 |

(Continued)

*Primary Examiner* — Hoang-Quan Ho
(74) *Attorney, Agent, or Firm* — Kile Park Reed & Houtteman PLLC

(57) ABSTRACT

A light emitting display device and a method of manufacturing a light emitting display device, the device including a substrate; a switching element on the substrate; a first electrode connected to the switching element; a second electrode on the first electrode; a light emitting element between the first electrode and the second electrode; and a non-conductive oxide film between the first electrode and the light emitting element.

18 Claims, 17 Drawing Sheets

(56) References Cited

U.S. PATENT DOCUMENTS

| | | | |
|---|---|---|---|
| 2005/0285509 A1* | 12/2005 | Funamoto | H01L 51/5275 313/504 |
| 2007/0052119 A1* | 3/2007 | Sakai | G02F 1/133516 264/1.7 |
| 2008/0024402 A1* | 1/2008 | Nishikawa | H01L 51/5209 345/82 |
| 2014/0131692 A1* | 5/2014 | Mishima | H01L 51/5088 257/40 |
| 2016/0133874 A1 | 5/2016 | Kim et al. | |

FOREIGN PATENT DOCUMENTS

| | | |
|---|---|---|
| KR | 10-2012-0005769 A | 1/2012 |
| KR | 10-2016-0055333 A | 5/2016 |
| KR | 10-2016-0101271 A | 8/2016 |

* cited by examiner

LIGHT EMITTING DISPLAY DEVICE AND METHOD FOR FABRICATING THE SAME

CROSS-REFERENCE TO RELATED APPLICATION

Korean Patent Application No. 10-2017-0127619, filed on Sep. 29, 2017, in the Korean Intellectual Property Office, and entitled: "Light Emitting Display Device and Method for Fabricating the Same," is incorporated by reference herein in its entirety.

BACKGROUND

1. Field

Embodiments relate to a light emitting display device and a method of manufacturing the light emitting display device.

2. Description of the Related Art

Flat panel display (FPD) devices have an advantage of reduced weight and volume, which are a disadvantage of a cathode ray tube (CRT). Such FPD devices may include, e.g., liquid crystal display (LCD) devices, field emission display (FED) devices, plasma display panel (PDP) devices, and organic light emitting diode (OLED) display devices.

Among the FPD devices, the OLED display devices display images using OLEDs that generate light by recombination of electrons and holes.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Embodiments are directed to a light emitting display device and a method of manufacturing the light emitting display device.

The embodiments may be realized by providing a light emitting display device including a substrate; a switching element on the substrate; a first electrode connected to the switching element; a second electrode on the first electrode; a light emitting element between the first electrode and the second electrode; and a non-conductive oxide film between the first electrode and the light emitting element.

The non-conductive oxide film may contact an entire surface of the light emitting element that faces the substrate.

The light emitting display device may further include a light blocking layer on the substrate, the light blocking layer defining a light emission area of the substrate.

The non-conductive oxide film may be between the light blocking layer and the substrate.

The non-conductive oxide film may overlap an entirety of the substrate.

The light blocking layer may include an inorganic material or an organic material.

An interface between the first electrode and the non-conductive oxide film may have a concave-convex shape or a planar shape.

The non-conductive oxide film may have a thickness that is less than a thickness of the light blocking layer.

The thickness of the non-conductive oxide film may be 0.5 nm to 10 nm.

The thickness of the light blocking layer may be 0.1 µm to 4 µm.

The non-conductive oxide film may have a thickness that is less than a thickness of the first electrode.

The non-conductive oxide film may include an organic material or an inorganic material.

The non-conductive oxide film may include a silicon oxide, an aluminum oxide, a molybdenum oxide, a tungsten oxide, or a siloxane.

The embodiments may be realized by providing a method of manufacturing a light emitting display device, the method including forming a switching element on a substrate; forming a first electrode connected to the switching element; forming a non-conductive oxide film on the first electrode; forming an insulating layer on the non-conductive oxide film; forming a photoresist pattern on the insulating layer; forming a light blocking layer such that the light blocking exposes a region of the non-conductive oxide film by removing a portion of the insulating layer using the photoresist pattern as a mask; forming a light emitting element on the region of the non-conductive oxide film exposed through the light blocking layer; and forming a second electrode on the light emitting element.

The non-conductive oxide film may contact an entire surface of the light emitting element that faces the substrate.

The non-conductive oxide film may overlap an entirety of the substrate.

An interface between the first electrode and the non-conductive oxide film may have a concave-convex shape or a planar shape.

The non-conductive oxide film may have a thickness that is less than a thickness of the light blocking layer.

The non-conductive oxide film may include a silicon oxide, an aluminum oxide, a molybdenum oxide, a tungsten oxide, or a siloxane.

The non-conductive oxide film may have a thickness of 0.5 nm to 10 nm, and the light blocking layer may have a thickness of 0.1 µm to 4 µm.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
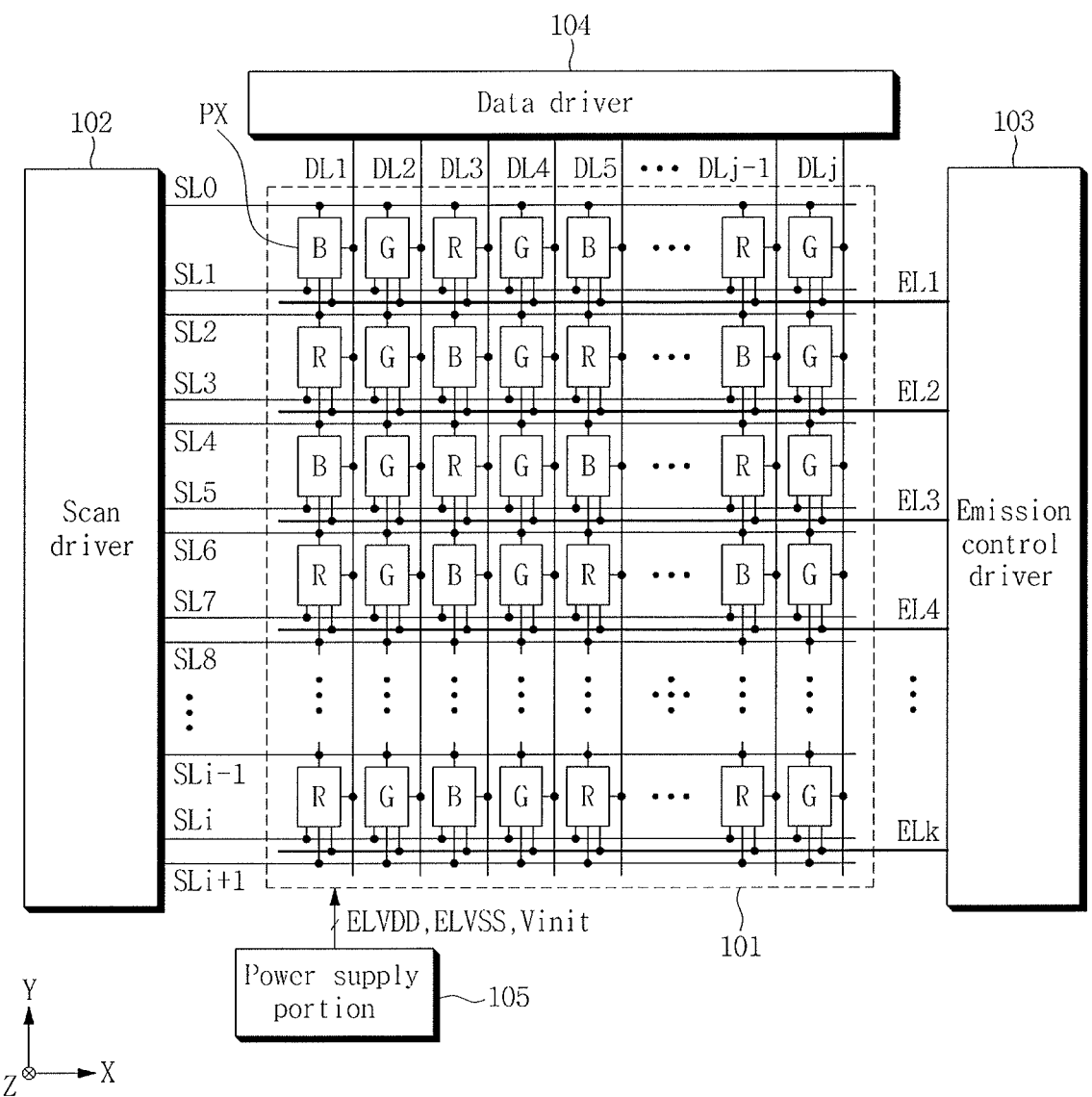
FIG. 1 illustrates a block diagram of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, thicknesses of a plurality of layers and areas may be illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this application pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the present specification. As used herein, the term "or" is not an exclusive term, e.g., "A or B" could include A, B, or A and B.

Some of the parts which are not associated with the description may not be provided in order to specifically describe exemplary embodiments and like reference numerals refer to like elements throughout the specification.

Hereinafter, a light emitting display device according to an exemplary embodiment will be described with reference to FIGS. 1 to 10B.

FIG. 1 illustrates a block diagram of a light emitting display device according to an exemplary embodiment.

A light emitting display device 100 according to an exemplary embodiment may include a display panel 101, a scan driver 102, an emission control driver 103, a data driver 104, and a power supply portion 105, as illustrated in FIG. 1.

The display panel 101 may include "i+2" number of scan lines SL0 to SLi+1, "i" number of emission control lines EL1 to ELk, "j" number of data lines DL1 to DLj and "i*j" number of pixels PX, where each of i, j and k is a natural number greater than 1.

The scan lines SL0 to SLi+1 may be arranged along a Y-axis direction, and each of the scan lines SL0 to SLi+1 may extend along an X-axis direction. The emission control lines EL1 to ELk may be arranged along the Y-axis direction, and each of the emission control lines EL1 to ELk may extend along the X-axis direction. The data lines DL1 to DLj may be arranged along the X-axis direction and each of the data lines DL1 to DLj may extend along the Y-axis direction.

A scan line SL0 of the aforementioned scan lines SL0 to SLi+1 that is closest to the data driver 104 is defined as a first dummy scan line SL0, a scan line SLi+1 of the aforementioned scan lines SL0 to SLi+1 that is farthest from the data driver 104 is defined as a second dummy scan line SLi+1. In addition, the scan lines SL1 to SLi between the first dummy scan line SL0 and the second dummy scan line SLi+1 are respectively defined as first to i-th scan lines SL1 to SLi sequentially from a scan line that is close to the data driver 104.

The scan driver 102 generates scan signals according to a scan control signal provided from a timing controller and sequentially applies the scan signals to the plurality of scan lines SL0 to SLi+1. The scan driver 102 outputs first to i-th scan signals, a first dummy scan signal and a second dummy scan signal. The first to i-th scan signals output from the scan driver 102 are applied to the first to i-th scan lines SL1 to SLi, respectively. For example, an n-th scan signal is applied to an n-th scan line SLn, where n is a natural number greater than or equal to 1 and less than or equal to i. In addition, the first dummy scan signal output from the scan driver 102 is applied to the first dummy scan line SL0 and the second dummy scan signal output from the scan driver 102 is applied to the second dummy scan line SLi+1.

During one frame period, the scan driver 102 outputs the first to i-th scan signals sequentially from the first scan signal. In such an exemplary embodiment, the scan driver 102 outputs the first dummy scan signal prior to the first scan signal and outputs the second dummy scan signal later than the i-th scan signal. For example, the scan driver 102 outputs the first dummy scan signal firstly during said one frame period and outputs the second dummy scan signal lastly during said one frame period. Accordingly, during one frame period, the entire scan lines SL0 to SLi+1 including the dummy scan lines SL0 and SLi+1 are driven sequentially from the first dummy scan line SL0.

The emission control driver 103 generates emission control signals according to a control signal provided from a timing controller and sequentially applies the emission control signals to the plurality of emission control lines EL1 to ELk. First to m-th emission control signals output from the emission control driver 103 are applied to first to m-th emission control lines, respectively. For example, the m-th emission control signal is applied to the m-th emission control line, where m is a natural number greater than or equal to 1 and less than or equal to k. During one frame period, the emission control driver 103 outputs the first to k-th emission control signals sequentially from the first emission control signal. Accordingly, during one frame period, the entire emission control lines EL1 to ELk are driven sequentially from the first emission control line EL1.

In an exemplary embodiment, the emission control driver 103 may be embedded in the scan driver 102. For example, the scan driver 102 may further perform the function of the emission control driver 103. In such an exemplary embodiment, the scan lines SL0 to SLi+1 and the emission control lines EL1 to ELk are driven together by the scan driver 102.

The emission control driver 103 and the scan driver 102 may be embedded in the display panel.

The data driver 104 applies first to i-th data voltages to the first to j-th data lines DL1 to DLj, respectively. For example, the data driver 104 receives image data signals and a data control signal from a timing controller (not illustrated). The data driver 104 then samples the image data signals according to the data control signal, latches the sampled image data signals corresponding to one horizontal line in each horizontal period, and applies the latched image data signals to the data lines DL1 to DLj substantially simultaneously.

The pixels PX are arranged at the display panel 101 in the form of a matrix. The pixels PX may be disposed at a display area of the display panel 101. The pixels PX emit lights having different colors. For example, of pixels PX illustrated in FIG. 1, a pixel indicated by a symbol "R" is a red pixel which emits a red light, a pixel indicated by a symbol "G" is a green pixel which emits a green light, and a pixel indicated by a symbol "B" is a blue pixel which emits a blue light.

In an implementation, the display panel 101 may further include at least one white pixel which emits a white light.

One pixel is connected to at least one scan line. As an example, as illustrated in FIG. 1, of a plurality of pixels PX connected to the first data line DL1, a blue pixel which is located closest to the data driver 104 is connected to three scan lines, e.g., the first dummy scan line SL0, the first scan line SL1 and the second scan line SL2, which receive scan signals each having different output timings. In an implementation, of a plurality of pixels PX connected to the second data line DL2, a green pixel which is located third farthest from the data driver 104 is connected to three scan lines, e.g., the fourth scan line SL4, the fifth scan line SL5 and the sixth scan line SL6, which receive scan signals each having different output timings.

Pixels that are connected in common to a same data line and located adjacent to each other are connected in common to at least one scan line. For example, two adjacent ones of the pixels connected to a same data line that are adjacent to each other in the Y-axis direction share at least one scan line. For example, a green pixel (hereinafter, "a first green pixel") which is connected to the second data line DL2 and is located closest to the data driver 104 and a green pixel (hereinafter, "a second green pixel") which is connected to the second data line DL2 and is located second farthest from the data driver 104 are located adjacent to each other and the first green pixel and the second green pixel are connected in common to the second scan line SL2. In an implementation, when defining a green pixel that is connected to the second data line DL2 and is located third farthest from the data driver 104 as a third green pixel, the third green pixel and the second green pixel are connected in common to the fourth scan line SL4.

Each of pixels connected in common to a same data line is independently connected to at least one different scan line. For example, the first green pixel described above is connected independently to the first scan line SL1, the second green pixel described above is connected independently to the third scan line SL3, and the third green pixel described above is connected independently to the fifth scan line SL5.

As such, each of pixels connected to a same data line is independently connected to at least one scan line. Hereinafter, the meaning of each of at least two pixels (e.g., the first pixel PX1 and the second pixel PX2) being connected to different scan lines is that at least one of scan lines connected to the first pixel PX1 is different from at least one of scan lines connected to the second pixel PX2. Accordingly, pixels connected to a same data line are connected to different scan lines, respectively.

On the other hand, the meaning of at least two pixels (e.g., the first pixel PX1 and the second pixel PX2) being connected to a same scan line is that scan lines connected to the first pixel PX1 are completely the same as scan lines connected to the second pixel PX2. Accordingly, each of pixels connected to a same emission control line is connected to same scan lines. For example, pixels connected in common to the second emission control line EL2 are connected in common to the second scan line SL2, the third scan line SL3 and the fourth scan line SL4.

The red pixel and the blue pixel are connected to a (2p−1)-th data line and the green pixel is connected to a 2q-th data line, where p is a natural number. For example, the red pixel and the blue pixel are connected to the first data line DL1 and the green pixel is connected to the second data line DL2.

One pixel (hereinafter, "a first predetermined pixel") connected to a (2p−1)-th data line (e.g., the first data line DL1) and one pixel (hereinafter, "a second predetermined pixel") connected to another (2p−1)-th data line (e.g., the third data line DL3) may be connected to a same scan line, and in such an exemplary embodiment, the first predetermined pixel emits a light having a color different from a color of a light emitted from the second predetermined pixel. For example, the first predetermined pixel is a blue pixel connected to the first dummy scan line SL0, the first scan line SL1, the second scan line SL2 and the first data line DL1, and the second predetermined pixel may be a red pixel connected to the first dummy scan line SL0, the first scan line SL1, the second scan line SL2 and the third data line DL3.

Two adjacent pixels connected to a same data line (e.g., the (2p−1)-th data line) and emitting lights having different colors and at least one green pixel adjacent to one of the two adjacent pixels are included in one unit pixel for displaying one unit image. For example, a red pixel connected to the third data line DL3 and the first scan line SL1, a blue pixel connected to the third data line DL3 and the third scan line SL3, a green pixel connected to the second data line DL2 and the first scan line SL1 and a green pixel connected to the fourth data line DL4 and the first scan line SL1 may form one unit pixel.

Each pixel PX commonly receives a high potential driving voltage ELVDD, a low potential driving voltage ELVSS and an initializing voltage Vinit from the power supply portion 105. In other words, one pixel receives all of the high potential driving voltage ELVDD, the low potential driving voltage ELVSS and the initializing voltage Vinit.

Figure 2:
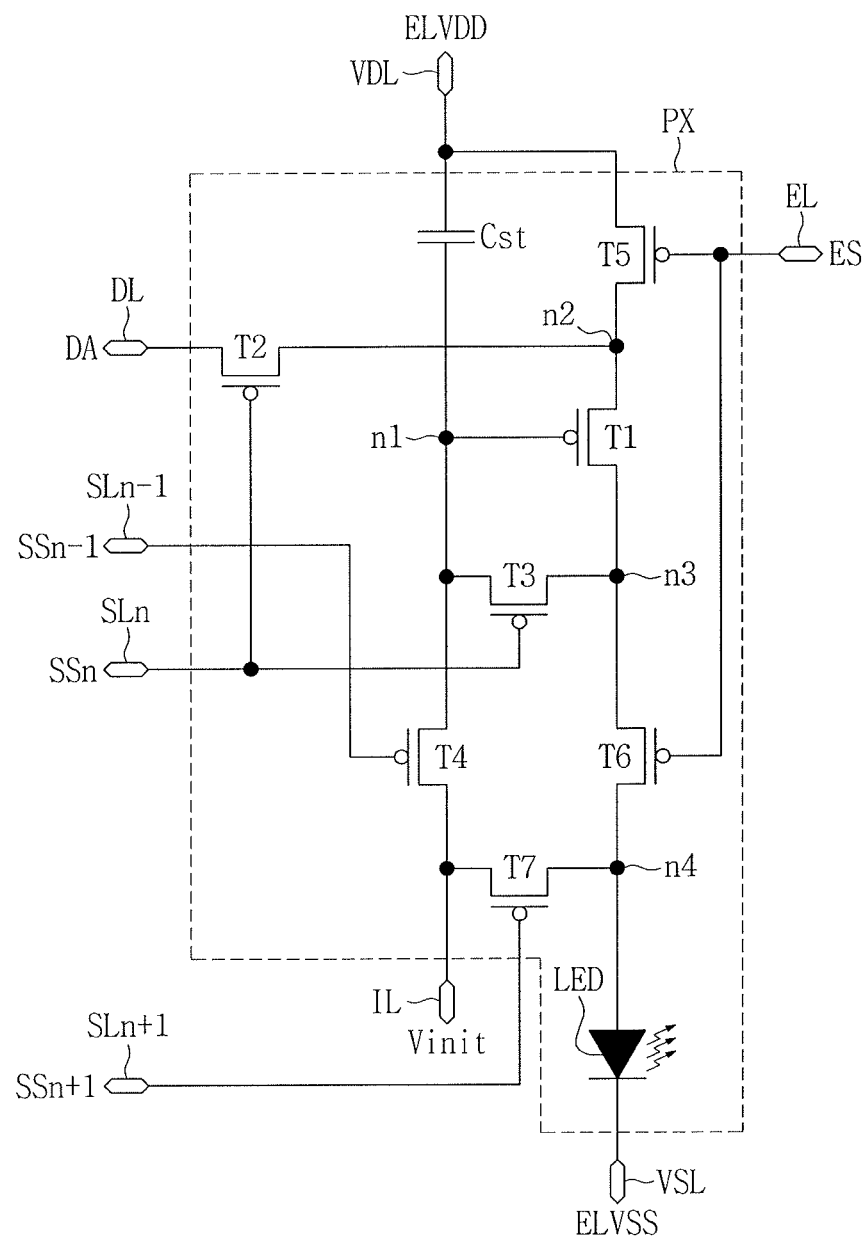
FIG. 2 illustrates an equivalent circuit diagram of a pixel of FIG. 1.

FIG. 2 illustrates an equivalent circuit diagram of a pixel of FIG. 1.

As illustrated in FIG. 2, one pixel PX includes a first switching element T1, a second switching element T2, a third switching element T3, a fourth switching element T4, a fifth switching element T5, a sixth switching element T6, a seventh switching element T7, a storage capacitor Cst and a light emitting element (hereinafter, denoted as a light emitting diode ("LED")).

Each of the first, second, third, fourth, fifth, sixth and seventh switching elements T1, T2, T3, T4, T5, T6 and T7 may be a P-type transistor, as illustrated in FIG. 2. However, exemplary embodiments are not limited thereto, and in an exemplary embodiment, each of the first, second, third, fourth, fifth, sixth and seventh switching elements T1, T2, T3, T4, T5, T6 and T7 may be an N-type transistor.

The first switching element T1 includes a gate electrode connected to a first node n1 and is connected between a second node n2 and a third node n3. One of a source electrode and a drain electrode of the first switching element T1 is connected to the second node n2 and the other of the source electrode and the drain electrode of the first switching element T1 is connected to the third node n3.

The second switching element T2 includes a gate electrode connected to the n-th scan line SLn and is connected between the data line DL and the second node n2. One of a source electrode and a drain electrode of the second switching element T2 is connected to the data line DL and the other of the source electrode and the drain electrode of the second switching element T2 is connected to the second node n2. An n-th scan signal SSn is applied to the n-th scan line SLn.

The third switching element T3 includes a gate electrode connected to the n-th scan line SLn and is connected between the first node n1 and the third node n3. One of a source electrode and a drain electrode of the third switching element T3 is connected to the first node n1 and the other of the source electrode and the drain electrode of the third switching element T3 is connected to the third node n3.

The fourth switching element T4 includes a gate electrode connected to an (n−1)-th scan line SLn−1 and is connected between the first node n1 and an initialization line IL. One of a source electrode and a drain electrode of the fourth switching element T4 is connected to the first node n1 and the other of the source electrode and the drain electrode of the fourth switching element T4 is connected to the initialization line IL. The aforementioned initializing voltage Vinit is applied to the initialization line IL and an (n−1)-th scan signal SSn−1 is applied to the (n−1)-th scan line SLn−1.

The fifth switching element T5 includes a gate electrode connected to the emission control line EL and is connected between a high potential line VDL, which is one of power supply lines, and the second node n2. One of a source electrode and a drain electrode of the fifth switching element T5 is connected to the high potential line VDL and the other of the source electrode and the drain electrode of the fifth switching element T5 is connected to the second node n2. The aforementioned high potential driving voltage ELVDD is applied to the high potential line VDL.

The sixth switching element T6 includes a gate electrode connected to the emission control line EL and is connected between the third node n3 and a fourth node n4. One of a source electrode and a drain electrode of the sixth switching element T6 is connected to the third node n3 and the other of the source electrode and the drain electrode of the sixth switching element T6 is connected to the fourth node n4. An emission control signal ES is applied to the emission control line EL.

The seventh switching element T7 includes a gate electrode connected to an (n+1)-th scan line SLn+1 and is connected between the initialization line IL and the fourth node n4. One of a source electrode and a drain electrode of the seventh switching element T7 is connected to the initialization line IL, and the other of the source electrode and the drain electrode of the seventh switching element T7 is connected to the fourth node n4. An (n+1)-th scan signal SSn+1 is applied to the (n+1)-th scan line SLn+1.

The storage capacitor Cst is connected between the high potential line VDL and the first node n1. The storage capacitor Cst stores a signal applied to the gate electrode of the first switching element T1 for one frame period.

The LED emits light in accordance with a driving current applied through the first switching element T1. The LED emits a light having different brightness depending on a magnitude of the driving current. An anode electrode of the LED is connected to the fourth node n4 and a cathode electrode of the LED is connected to the low potential line VSL which is another of the power supply lines. The aforementioned low potential driving voltage ELVSS is applied to this low potential line VSL. The LED may be an organic light emitting diode ("OLED"). The anode electrode of the LED corresponds to a first electrode to be described below and the cathode electrode thereof corresponds to a second electrode to be described below.

The fourth switching element T4 is turned on when the (n−1)-th scan signal SSn−1 is applied to the (n−1)-th scan line SLn−1. The initializing voltage Vinit is applied to the first node n1 (i.e., the gate electrode of the first switching element T1) through the turned-on fourth switching element T4. Accordingly, the voltage of the gate electrode of the first switching element T1 is initialized.

The second switching element T2 and the third switching element T3 are turned on when the n-th scan signal SSn is applied to the n-th scan line SLn. A data voltage DA is applied to the first node n1 (i.e., the gate electrode of the first switching element T1) through the turned-on second switching element T2, and accordingly, the first switching element T1 is turned on. Accordingly, a threshold voltage of the first switching element T1 is detected and the threshold voltage is stored in the storage capacitor Cst.

The fifth switching element T5 and the sixth switching element T6 are turned on when the emission control signal ES is applied to the emission control line EL. A driving current is applied to the LED through the turned-on fifth switching element T5, the turned-on first switching element T1 and the turned-on sixth switching element T6 such that the LED emits light.

The seventh switching element T7 is turned on when the (n+1)-th scan signal SSn+1 is applied to the (n+1)-th scan line SLn+1. The initializing voltage is applied to the fourth node n4 (i.e., the anode electrode of the LED) through the turned-on seventh switching element T7. Accordingly, the LED is biased in a reverse direction such that the LED is turned off.

Figure 3:
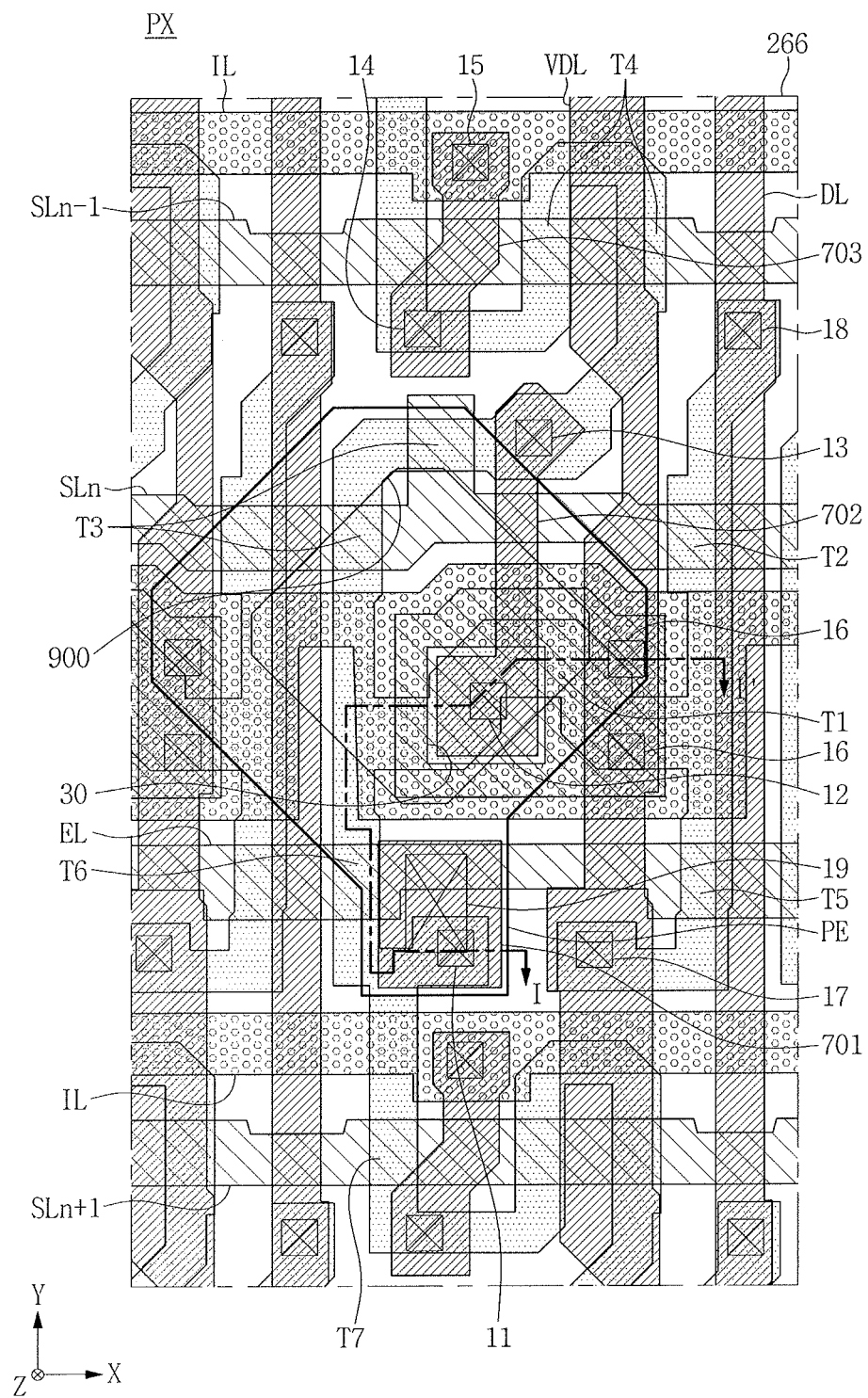
FIG. 3 illustrates a detailed plan view of a display device including a pixel and lines connected thereto of FIG. 1.
Figure 4A:
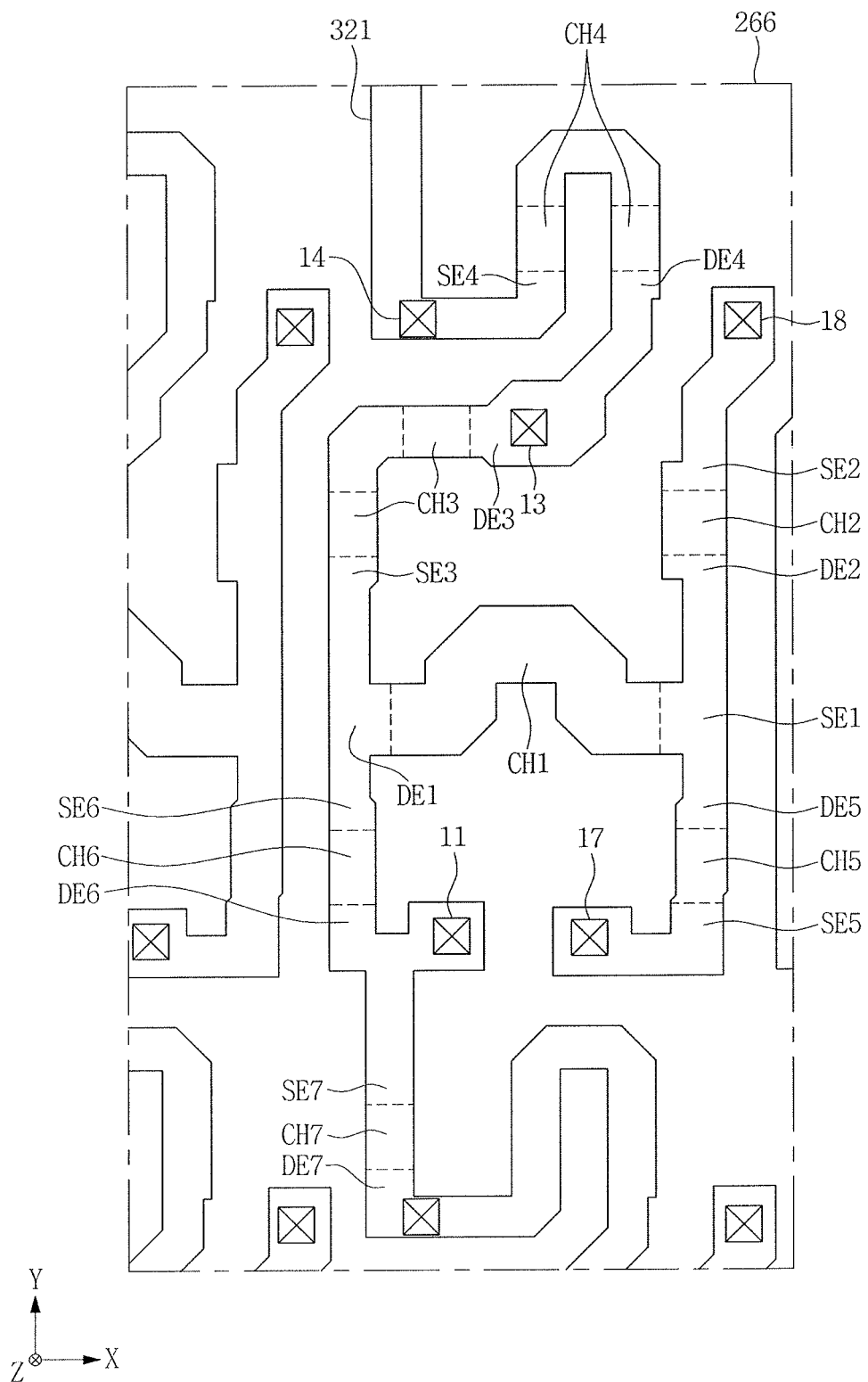
FIGS. 4A, 4B, 4C, 4D, 4E, 4F, and 4G illustrate views of a part of elements of FIG. 3.
Figure 4B:
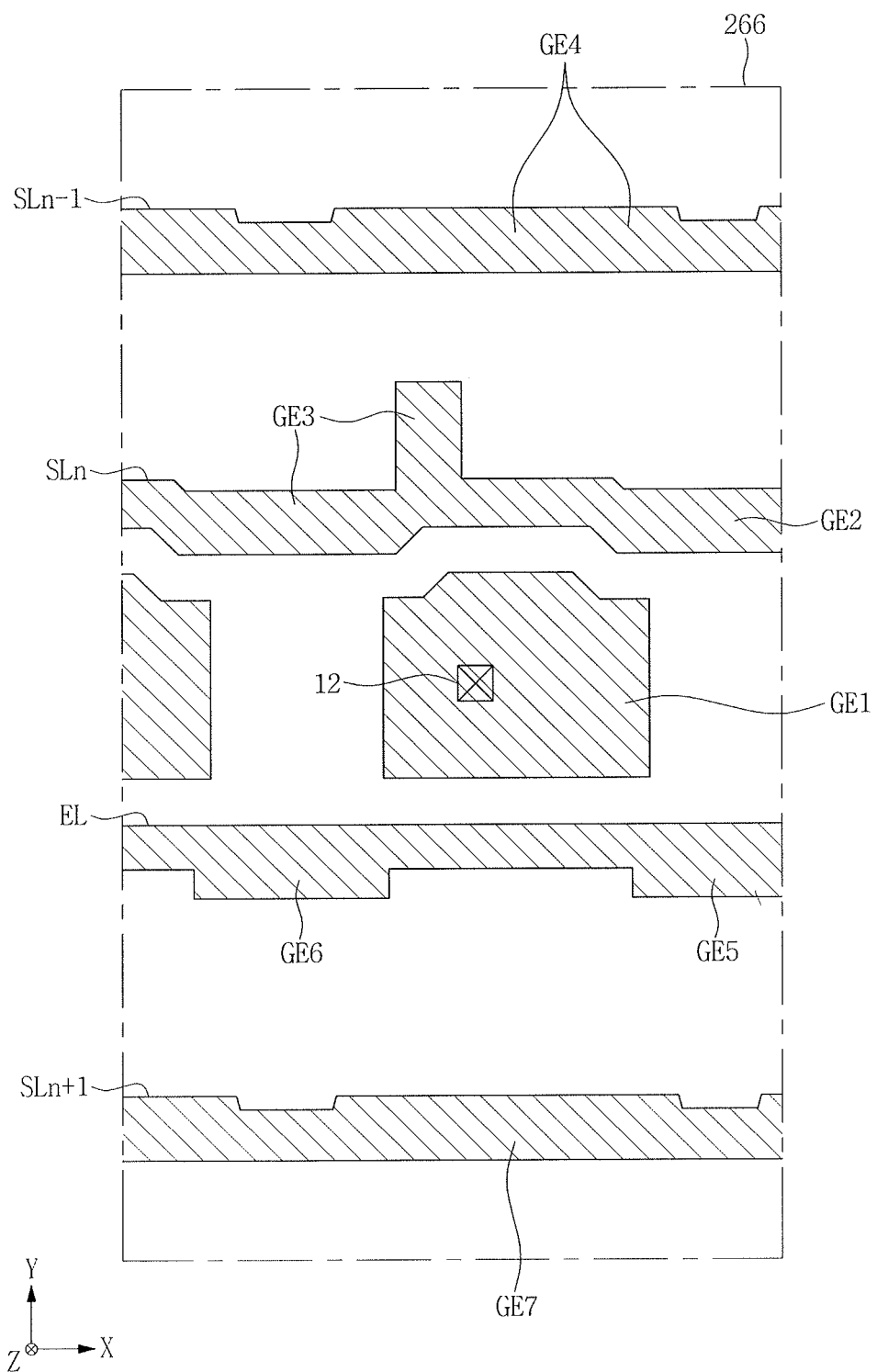
Figure 4C:
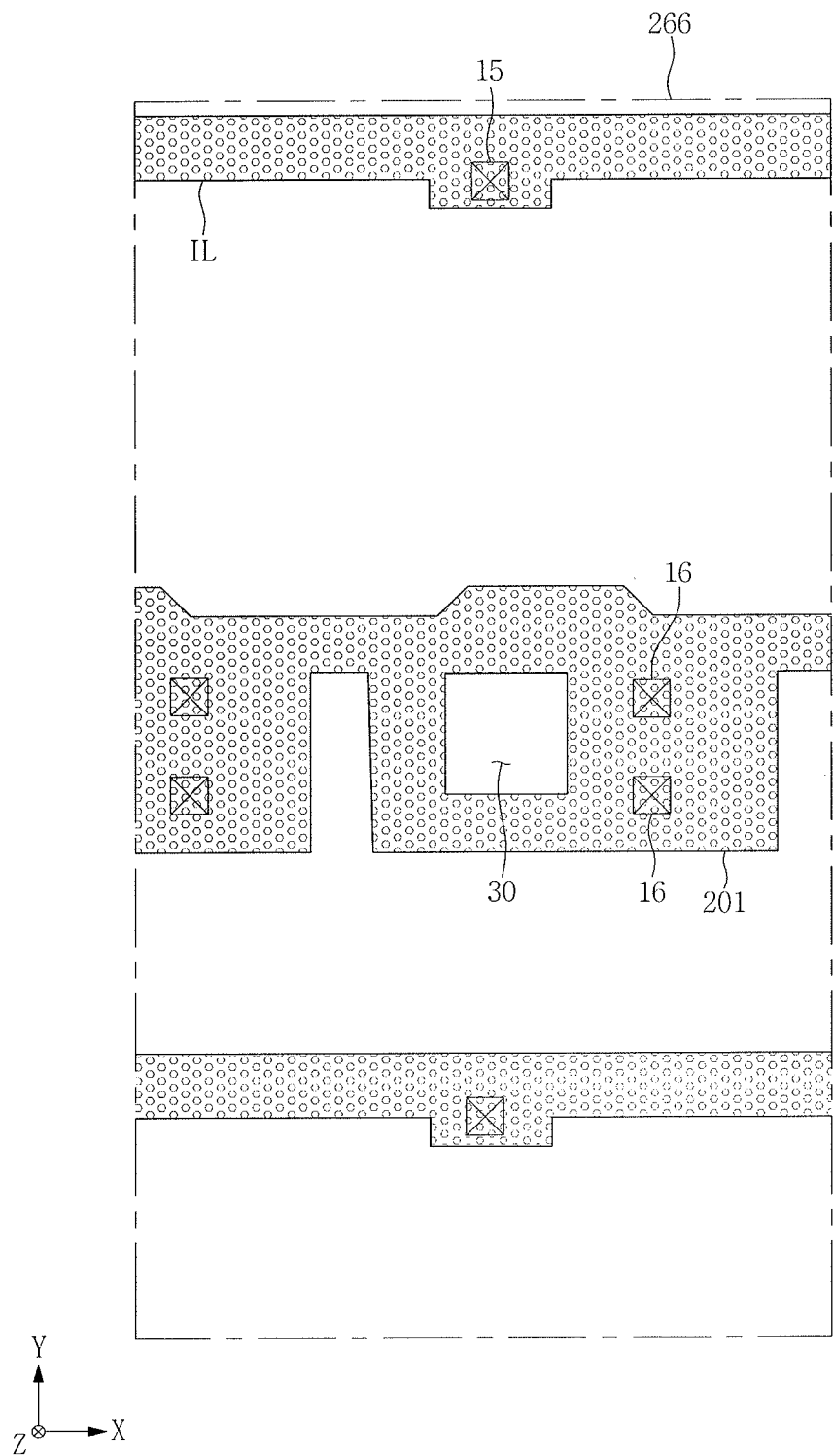
Figure 4D:
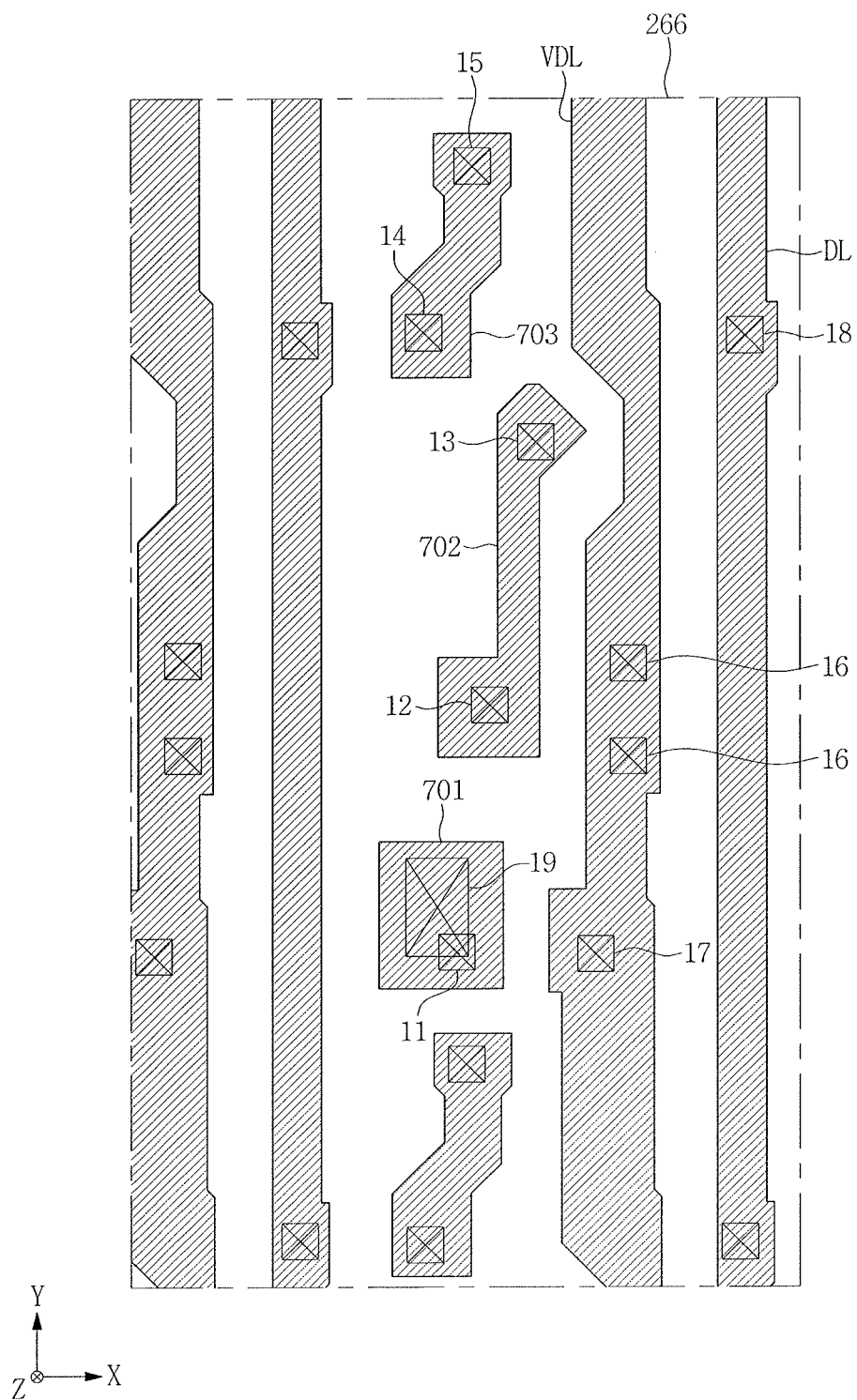
Figure 4E:
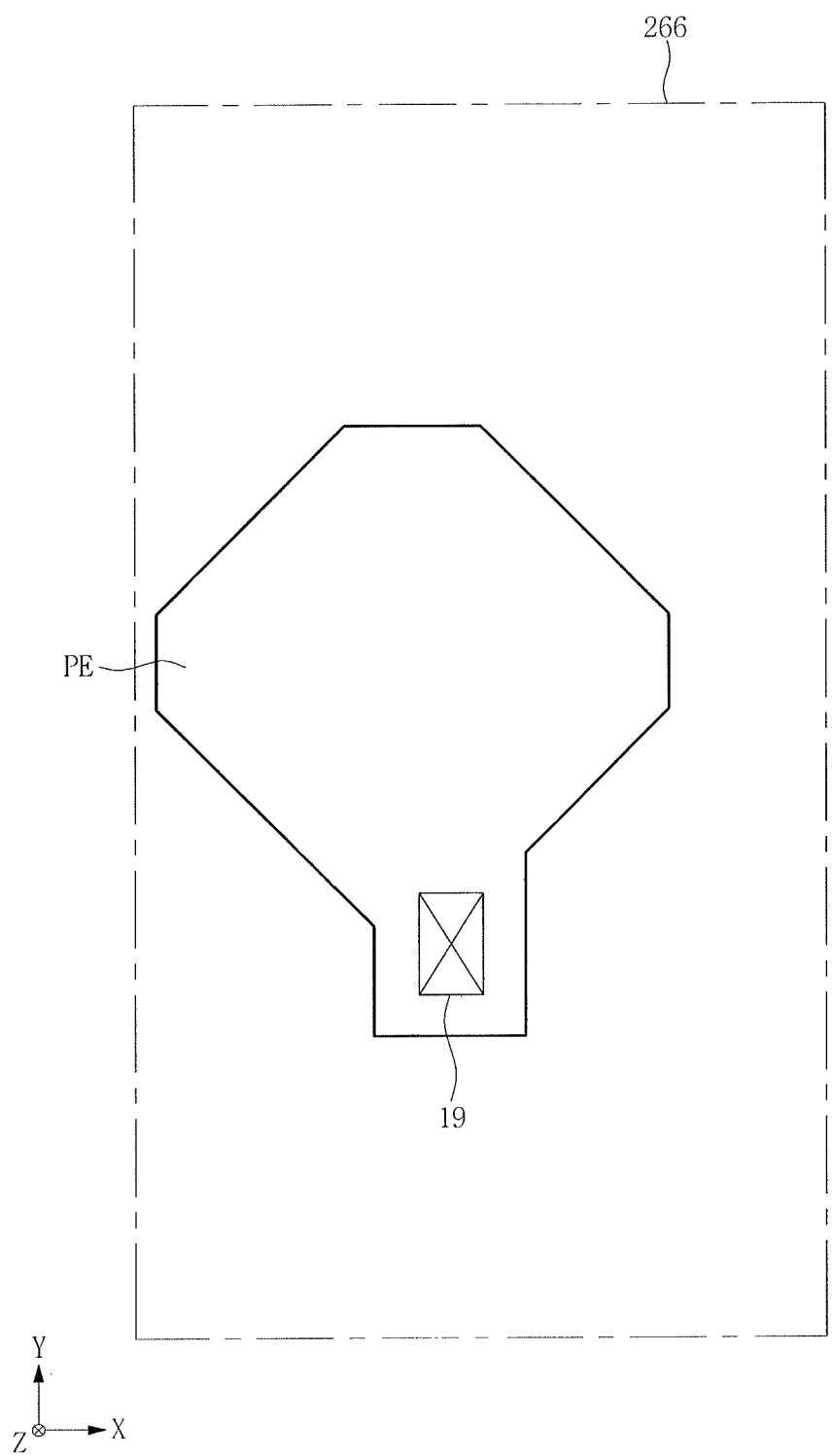
Figure 4F:
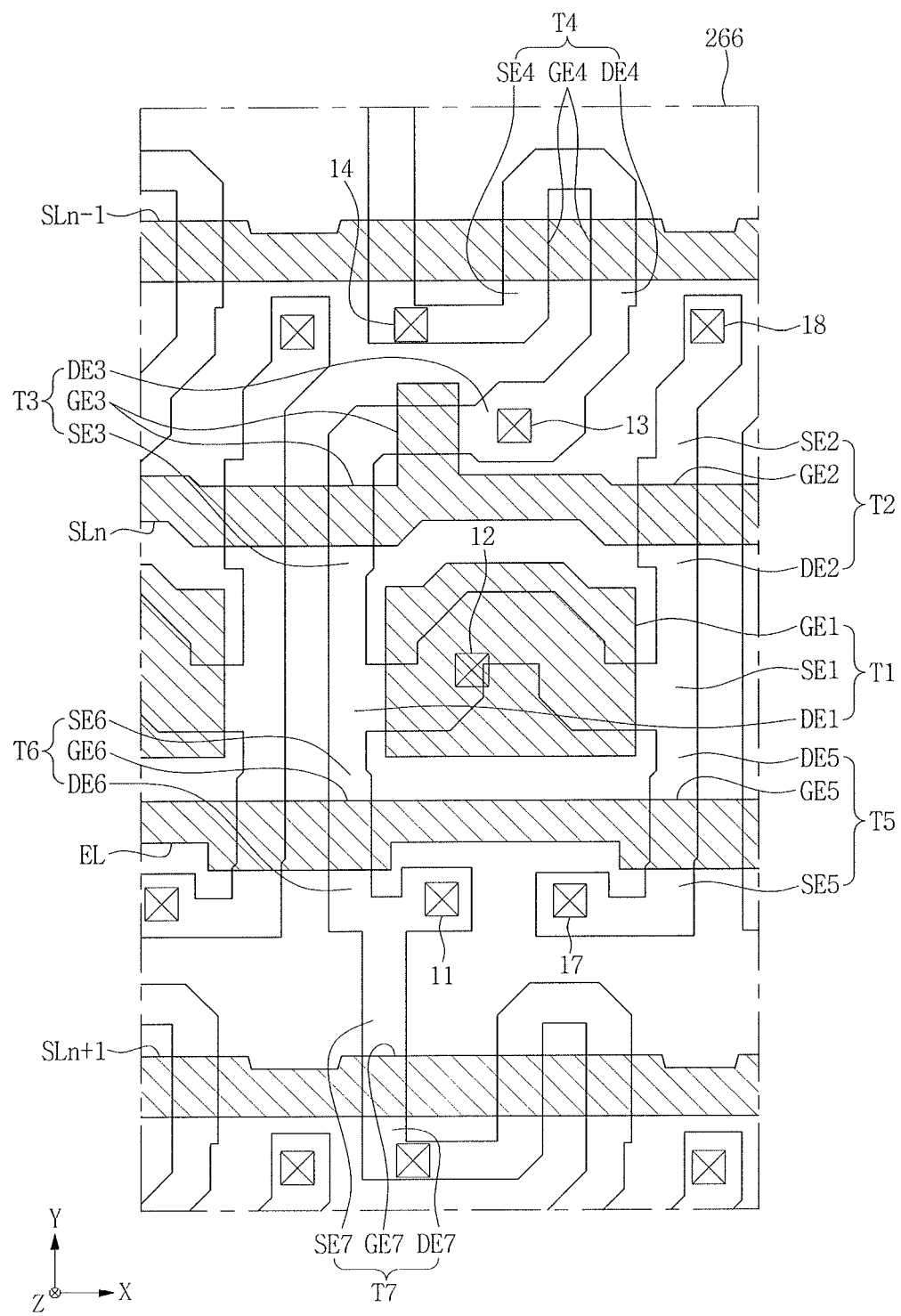
Figure 4G:
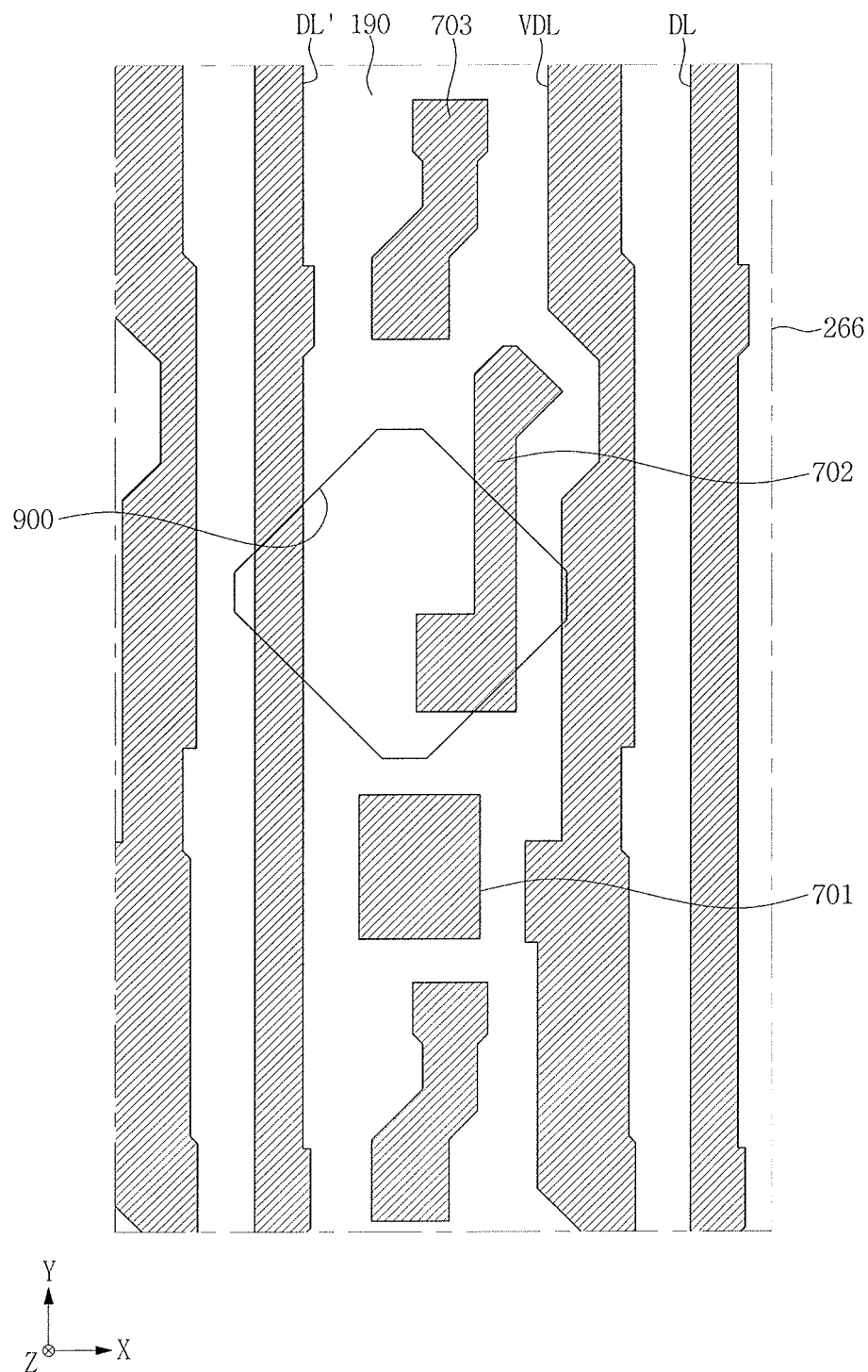
Figure 5:
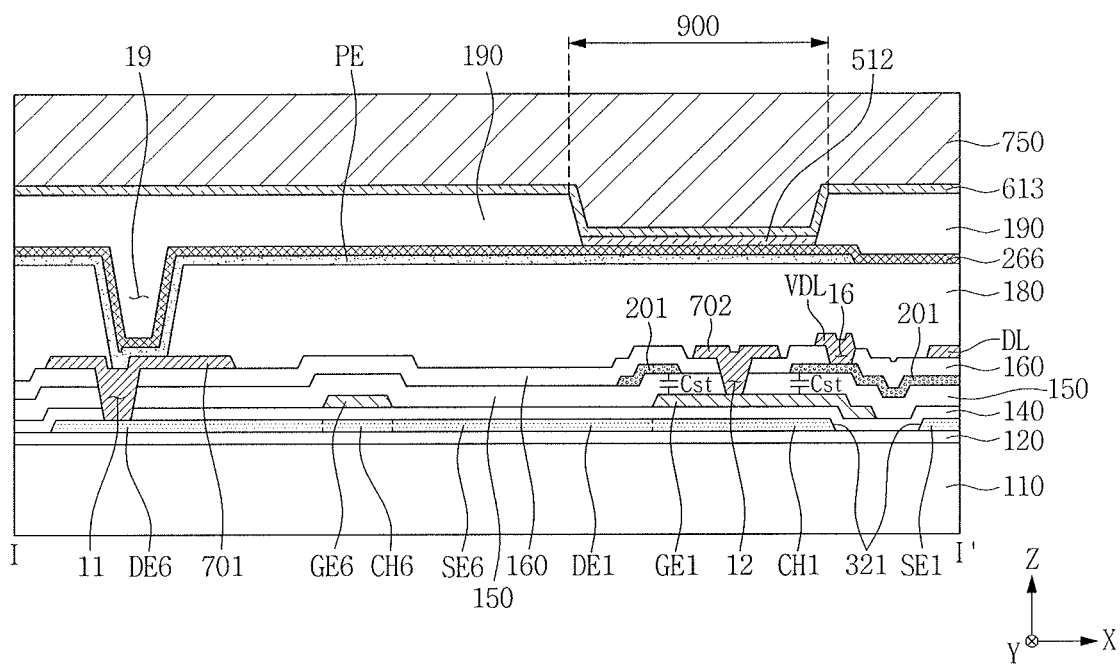
FIG. 5 illustrates a cross-sectional view taken along the line I-I' of FIG. 3.
Figure 6:
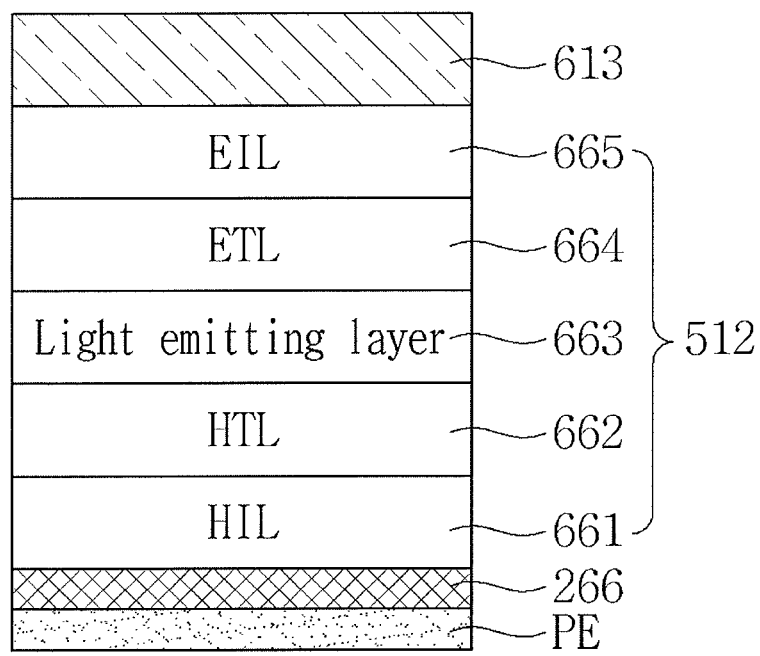
FIG. 6 illustrates a detailed configuration view of a light emitting element of FIG. 5.

FIG. 3 illustrates a detailed plan view of a display device including a pixel and lines connected thereto of FIG. 1, FIGS. 4A, 4B, 4C, 4D, 4E, 4F, and 4G illustrate views of a part of elements of FIG. 3, FIG. 5 illustrates a cross-sectional view taken along the line I-I' of FIG. 3, and FIG. 6 illustrates a detailed configuration view of a light emitting element of FIG. 5.

For example, FIG. 4A illustrates a semiconductor layer 321 of FIG. 3, FIG. 4B illustrates the (n−1)-th scan line SLn−1, the n-th scan line SLn, the (n+1)-th scan line SLn+1 and the emission control line EL of FIG. 3, FIG. 4C illustrates the initialization line IL and a capacitor electrode 201 of FIG. 3, FIG. 4D illustrates the data line DL and the high potential line VDL of FIG. 3, FIG. 4E illustrates a pixel electrode PE of FIG. 3, FIG. 4F illustrates the semiconductor layer 321, the (n−1)-th scan line SLn−1, the n-th scan line SLn, the (n+1)-th scan line SLn+1 and the emission control line EL of FIG. 3, and FIG. 4G illustrates a first connection electrode 701, a second connection electrode 702, a third connection electrode 703, the data line DL, the high potential line VDL and a light blocking layer 190 of FIG. 3.

In an exemplary embodiment, FIGS. 4A, 4B, 4C, 4D, 4E, 4F, and 4G commonly include a non-conductive oxide film 266.

As illustrated in FIGS. 3, 4, and 5, a display device according to an exemplary embodiment may include, e.g., a substrate 110, a buffer layer 120, a semiconductor layer 321, a gate insulating layer 140, a first gate electrode GE1, a second gate electrode GE2, a third gate electrode GE3, a fourth gate electrode GE4, a fifth gate electrode GE5, a sixth gate electrode GE6, a seventh gate electrode GE7, an (n−1)-th scan line SLn−1, an n-th scan line SLn, an (n+1)-th scan line SLn+1, an emission control line EL, a first insulating interlayer 150, an initialization line IL, a capacitor electrode 210, a second insulating interlayer 160, a first connection electrode 701, a second connection electrode 702, a third connection electrode 703, a data line DL, a high potential line VDL, a planarization layer 180, a first electrode (hereinafter, "a pixel electrode PE"), a non-conductive oxide film 266, a light blocking layer 190, a light emitting element 512, a second electrode (hereinafter, "a common electrode 613"), and a sealing member 750.

As illustrated in FIGS. 3 and 4F, the first switching element T1 may include the first gate electrode GE1, a first source electrode SE1 and a first drain electrode DE1.

As illustrated in FIGS. 3 and 4F, the second switching element T2 may include the second gate electrode GE2, a second source electrode SE2 and a second drain electrode DE2.

As illustrated in FIGS. 3 and 4F, the third switching element T3 may include the third gate electrode GE3, a third source electrode SE3 and a third drain electrode DE3.

As illustrated in FIGS. 3 and 4F, the fourth switching element T4 may include the fourth gate electrode GE4, a fourth source electrode SE4 and a fourth drain electrode DE4.

As illustrated in FIGS. 3 and 4F, the fifth switching element T5 may include the fifth gate electrode GE5, a fifth source electrode SE5 and a fifth drain electrode DE5.

As illustrated in FIGS. 3 and 4F, the sixth switching element T6 may include the sixth gate electrode GE6, a sixth source electrode SE6 and a sixth drain electrode DE6.

As illustrated in FIGS. 3 and 4F, the seventh switching element T7 may include the seventh gate electrode GE7, a seventh source electrode SE7 and a seventh drain electrode DE7.

The substrate 110 illustrated in FIG. 5 may be a transparent insulating substrate including glass or transparent plastic. In an implementation, the substrate 110 may include or be formed of, e.g., Kapton, polyethersulphone (PES), polycarbonate (PC), polyimide (PI), polyethyleneterephthalate (PET), polyethylene naphthalate (PEN), polyacrylate, fiber reinforced plastic (FRP), or the like.

As illustrated in FIG. 5, the buffer layer 120 may be disposed on the substrate 110. The buffer layer 120 may be disposed over an entire surface of the substrate 110 (e.g., an entirety of the substrate). The buffer layer 120 may help substantially prevent permeation of undesirable elements and to planarize a surface therebelow and may include suitable materials for planarizing and/or preventing permeation. In an implementation, the buffer layer 120 may include, e.g., a silicon nitride ($SiN_x$) layer, a silicon oxide ($SiO_2$) layer, or a silicon oxynitride ($SiO_xN_y$) layer. In an implementation, the buffer layer 120 may be omitted based on the kinds of the substrate 110 and process conditions thereof.

As illustrated in FIG. 5, the semiconductor layer 321 may be located on the buffer layer 120.

As illustrated in FIG. 4A, the semiconductor layer 321 provides respective channel areas CH1, CH2, CH3, CH4, CH5, CH6 and CH7 of the first, second, third, fourth, fifth, sixth and seventh switching elements T1, T2, T3, T4, T5, T6 and T7. In addition, the semiconductor layer 321 provides the respective source electrodes SE1, SE2, SE3, SE4, SE5, SE6 and SE7 and the respective drain electrodes DE1, DE2, DE3, DE4, DE5, DE6 and DE7 of the first, second, third, fourth, fifth, sixth and seventh switching elements T1, T2, T3, T4, T5, T6 and T7.

To this end, the semiconductor layer 321 may include a first channel area CH1, a second channel area CH2, a third channel area CH3, a fourth channel area CH4, a fifth channel area CH5, a sixth channel area CH6, a seventh channel area CH7, the first source electrode SE1, the second source electrode SE2, the third source electrode SE3, the fourth source electrode SE4, the fifth source electrode SE5, the sixth source electrode SE6, the seventh source electrode SE7, the first drain electrode DE1, the second drain electrode DE2, the third drain electrode DE3, the fourth drain electrode DE4, the fifth drain electrode DE5, the sixth drain electrode DE6 and the seventh drain electrode DE7.

The first source electrode SE1, the second drain electrode DE2 and the fifth drain electrode DE5 are connected to each other. For example, the first source electrode SE1, the second drain electrode DE2 and the fifth drain electrode DE5 may be formed unitarily.

The first drain electrode DE1, the third source electrode SE3 and the sixth source electrode SE6 are connected to each other. For example, the first drain electrode DE1, the third source electrode SE3 and the sixth source electrode SE6 may be formed unitarily.

The third drain electrode DE3 and the fourth drain electrode DE4 are connected to each other. For example, the third drain electrode DE3 and the fourth drain electrode DE4 may be formed unitarily.

The sixth drain electrode DE6 and the seventh source electrode SE7 are connected to each other. For example, the sixth drain electrode DE6 and the seventh source electrode SE7 may be formed unitarily.

In an implementation, the semiconductor layer 321 may include, e.g., a polycrystalline silicon film, an amorphous silicon film, or an oxide semiconductor such as indium-gallium-zinc oxide (IGZO) or indium zinc tin oxide (IZTO). For example, in the case where the semiconductor layer 321 includes a polycrystalline silicon film, the semiconductor layer 321 may include a channel area which is not doped with an impurity, and a source electrode and a drain electrode, on the opposite sides of the channel area, which are doped with impurities.

As illustrated in FIG. 5, the gate insulating layer 140 may be disposed on the semiconductor layer 321 and the buffer layer 110. In an implementation, the gate insulating layer 140 may include, e.g., tetraethylorthosilicate (TEOS), silicon nitride ($SiN_x$), or silicon oxide ($SiO_2$). For example, the gate insulating layer 140 may have a double-layer structure where a $SiN_x$ layer having a thickness of about 40 nm and a TEOS layer having a thickness of about 80 nm are sequentially stacked.

As illustrated in FIG. 5, the first gate electrode GE1 is located on the gate insulating layer 140. For example, the first gate electrode GE1 is located between the gate insulating layer 140 and the first insulating interlayer 150.

In an implementation, the second gate electrode GE2, the third gate electrode GE3, the fourth gate electrode GE4, the fifth gate electrode GE5, the sixth gate electrode GE6 and the seventh gate electrode GE 7 are also located on the gate insulating layer 140. For example, the second, third, fourth, fifth, sixth and seventh gate electrodes GE2, GE3, GE4, GE5, GE6 and GE7 are located between the gate insulating layer 140 and the first insulating interlayer 150.

In an implementation, the scan line and the emission control line are also located on the gate insulating layer. For example, the (n−1)-th scan line SLn−1, the n-th scan line SLn, the (n+1)-th scan line SLn+1 and the emission control line EL are located between the gate insulating layer 140 and the first insulating interlayer 150.

As illustrated in FIGS. 3 and 4F, the first gate electrode GE1 overlaps the first channel area CH1 of the semiconductor layer 321, the second gate electrode GE2 overlaps the second channel area CH2 of the semiconductor layer 321, the third gate electrode GE3 overlaps the third channel area CH3 of the semiconductor layer 321, the fourth gate electrode GE4 overlaps the fourth channel area CH4 of the semiconductor layer 321, the fifth gate electrode GE5 overlaps the fifth channel area CH5 of the semiconductor layer 321, the sixth gate electrode GE6 overlaps the sixth channel area CH6 of the semiconductor layer 321 and the seventh gate electrode GE7 overlaps the seventh channel area CH7 of the semiconductor layer 321.

As illustrated in FIGS. 4B and 4F, the fourth gate electrode GE4 is connected to the (n−1)-th scan line SLn−1, and in such an exemplary embodiment, the fourth gate electrode GE4 may be a portion of the (n−1)-th scan line SLn−1. For example, a portion of the (n−1)-th scan line SLn−1 that overlaps the semiconductor layer 321 may correspond to the fourth gate electrode GE4.

As illustrated in FIGS. 4B and 4F, the third gate electrode GE3 is connected to the n-th scan line SLn, and in such an exemplary embodiment, the third gate electrode GE3 may be a portion of the n-th scan line SLn. For example, a portion of the n-th scan line SLn that overlaps the semiconductor layer 321 may correspond to the third gate electrode GE3.

As illustrated in FIGS. 4B and 4F, the seventh gate electrode GE7 is connected to the (n+1)-th scan line SLn+1, and in such an exemplary embodiment, the seventh gate electrode GE7 may be a portion of the (n+1)-th scan line SLn+1. For example, a portion of the (n+1)-th scan line SLn+1 that overlaps the semiconductor layer 321 may correspond to the seventh gate electrode GE7.

As illustrated in FIGS. 4B and 4F, the fifth gate electrode GE5 and the sixth gate electrode GE6 are connected in common to one emission control line EL, and in such an exemplary embodiment, the fifth gate electrode GE5 and the sixth gate electrode GE6 may be portions of the emission control line EL. For example, two portions of the emission control line EL that overlap the semiconductor layer 321 may correspond to the fifth gate electrode GE5 and the sixth gate electrode GE6, respectively.

The scan line (e.g., at least one of the (n−1)-th scan line SLn−1, the n-th scan line SLn and the (n+1)-th scan line SLn+1) may include one of: aluminum (Al) or alloys thereof, silver (Ag) or alloys thereof, copper (Cu) or alloys thereof, molybdenum (Mo) or alloys thereof. In an implementation, the scan line may include one of chromium (Cr) and tantalum (Ta). In an implementation, the scan line may have a multilayer structure including at least two conductive layers that have different physical properties.

The first, second, third, fourth, fifth, sixth and seventh gate electrodes GE1, GE2, GE3, GE4, GE5, GE6 and GE7 may include a substantially same material and have a substantially same structure (e.g., a multilayer structure) as those of the scan line described above. Each of the gate electrodes GE1, GE2, GE3, GE4, GE5, GE6 and GE7 and the scan line may be substantially simultaneously formed in a substantially same process.

In addition, the emission control line EL may include a substantially same material and have a substantially same structure (e.g., a multilayer structure) as those of the above-described scan line. The emission control line EL and the scan line may be substantially simultaneously formed in a substantially same process.

As illustrated in FIG. 5, the first insulating interlayer 150 may be located on the first gate electrode GE1 and the gate insulating layer 140. The first insulating interlayer 150 may have a thickness that is greater than a thickness of the gate insulating layer 140. The first insulating interlayer 150 may include a material substantially the same as a material included in the gate insulating layer 140 described above.

In an implementation, the first insulating interlayer 150 is also formed on the second, third, fourth, fifth, sixth and seventh gate electrodes GE2, GE3, GE4, GE5, GE6 and GE7, each scan line (e.g., scan lines SLn−1, SLn, SLn+1) and the emission control line EL.

As illustrated in FIG. 5, the capacitor electrode 201 may be located on the first insulating interlayer 150. For example, the capacitor electrode 201 may be located between the first insulating interlayer 150 and the second insulating interlayer 160. The capacitor electrode 201 forms a storage capacitor Cst together with the first gate electrode GE1 described above. For example, the first gate electrode GE1 corresponds to a first electrode of the storage capacitor Cst and the capacitor electrode 201 corresponds to a second electrode of the storage capacitor Cst. For example, a portion of the first gate electrode GE1 overlapping the capacitor electrode 201 corresponds to the first electrode of the storage capacitor Cst and a portion of the capacitor electrode 201 overlapping the first gate electrode GE1 corresponds to the second electrode of the storage capacitor Cst.

In an implementation, the initialization line IL (see FIGS. 3 and 4C) may also be located on the first insulating interlayer 150. For example, the initialization line IL may be located between the first insulating interlayer 150 and the second insulating interlayer 160.

As illustrated in FIGS. 3 and 4C, the capacitor electrode 201 may have a hole 30. In an implementation, the hole 30 may have a quadrangular shape. In an implementation, the hole 30 may have various shapes such as circular and triangular shapes.

As illustrated in FIGS. 3 and 4C, the capacitor electrodes 201 of pixels adjacent to each other may be connected to each other. In other words, the capacitor electrodes 201 of pixels adjacent to each other in the X-axis direction may be formed unitarily.

As illustrated in FIG. 5, the second insulating interlayer 160 may be located on the capacitor electrode 201, the initialization line IL, and the first insulating interlayer 150. The second insulating interlayer 160 may have a thickness greater than a thickness of the gate insulating layer 140. The second insulating interlayer 160 may include a material substantially the same as a material included in the gate insulating layer 140 described above.

As illustrated in FIG. 5, the first connection electrode 701, the second connection electrode 702, the high potential line VDL and the data line DL may be located on the second insulating interlayer 160. For example, the first connection electrode 701, the second connection electrode 702, the high potential line VDL and the data line DL are located between the second insulating interlayer 160 and the planarization layer 180.

In an implementation, the third connection electrode 703 (see FIGS. 3 and 4D) is also located on the second insulating interlayer 160. For example, the third connection electrode 703 may be located between the second insulating interlayer 160 and the planarization layer 180.

As illustrated in FIG. 5, the first connection electrode 701 may be connected to the first source electrode SE1 through a first contact hole 11 which passes through the second insulating interlayer 160, the first insulating interlayer 150 and the gate insulating layer 140.

As illustrated in FIG. 5, the second connection electrode 702 may be connected to the first gate electrode GE1 through a second contact hole 12 which passes through the second insulating interlayer 160 and the first insulating interlayer 150. In addition, as illustrated in FIGS. 3, 4A and 4D, the second connection electrode 702 may be connected to the third drain electrode DE3 through a third contact hole 13. The third contact hole 13 passes through the second insulating interlayer 160, the first insulating interlayer 150 and the gate insulating layer 140 to expose the third drain electrode DE3.

As illustrated in FIGS. 3, 4A and 4D, the third connection electrode 703 may be connected to the fourth source electrode SE4 through a fourth contact hole 14. The fourth contact hole 14 passes through the second insulating interlayer 160, the first insulating interlayer 150 and the gate insulating layer 140 to expose the fourth source electrode SE4. In addition, as illustrated in FIGS. 3, 4C and 4D, the third connection electrode 703 is connected to the initialization line IL through a fifth contact hole 15. The fifth contact hole 15 passes through the second insulating interlayer 160 to expose the initialization line IL.

As illustrated in FIG. 5, the high potential line VDL may be connected to the capacitor electrode 201 through a sixth contact hole 16 which passes through the second insulating interlayer 160. In addition, as illustrated in FIGS. 3, 4A and 4D, the high potential line VDL is connected to the fifth source electrode SE5 through a seventh contact hole 17. The seventh contact hole 17 passes through the second insulating interlayer 160, the first insulating interlayer 150 and the gate insulating layer 140 to expose the fifth source electrode SE5.

As illustrated in FIGS. 3, 4A and 4D, the data line DL may be connected to the second source electrode SE2 through an eighth contact hole 18. The eighth contact hole 18 passes through the second insulating interlayer 160, the first insulating interlayer 150 and the gate insulating layer 140 to expose the second source electrode SE2.

The data line DL may include a refractory metal, such as molybdenum, chromium, tantalum and titanium, or an alloy thereof. The data line DL may have a multilayer structure including a refractory metal layer and a low-resistance conductive layer. Examples of the multilayer structure may include: a double-layer structure including a chromium or molybdenum (alloy) lower layer and an aluminum (alloy) upper layer; and a triple-layer structure including a molybdenum (alloy) lower layer, an aluminum (alloy) intermediate layer and a molybdenum (alloy) upper layer. In an implementation, the data line DL may include any suitable metals or conductors rather than the aforementioned materials.

The first connection electrode 701, the second connection electrode 702, the third connection electrode 703 and the high potential line VDL may include a substantially same material and have a substantially same structure (e.g., a multilayer structure) as those of the data line DL. Each of the first connection electrode 701, the second connection electrode 702, the third connection electrode 703 and the high potential line VDL may be substantially simultaneously formed in a substantially same process.

As illustrated in FIG. 5, the planarization layer 180 may be located on the first connection electrode 701, the second connection electrode 702, the third connection electrode 703, the high potential line VDL and the data line DL.

The planarization layer 180 may help substantially eliminate a step difference of the substrate 110 to planarize the substrate 110 so as to increase luminous efficiency of the light emitting element 512 to be formed thereon. In an implementation, the planarization layer 180 may include, e.g., a polyacrylate resin, an epoxy resin, a phenolic resin, a polyamide resin, a polyimide resin, an unsaturated polyester resin, a polyphenylene ether resin, a polyphenylene sulfide resin, or benzocyclobutene (BCB).

As illustrated in FIG. 5, the pixel electrode PE may be located on the planarization layer 180. A portion of or the entirety of the pixel electrode PE may be located in a light emission area 900. For example, the pixel electrode PE may be located corresponding to or aligned with the light emission area 900 defined by the light blocking layer 190 to be described below. The pixel electrode PE may be connected to the first connection electrode 701 through a ninth contact hole 19 that passes through the planarization layer 180.

As illustrated in FIGS. 3 and 4E, the pixel electrode PE may have a rhombic shape. In an implementation, the pixel electrode PE may have various shapes, e.g., a quadrangular shape, other than the rhombic shape.

As illustrated in FIG. 5, the non-conductive oxide film 266 may be located on the pixel electrode PE and the planarization layer 180. In such an exemplary embodiment, the non-conductive oxide film 266 may be located over an entire surface of (e.g., an entirety of) the substrate 110 (including the pixel electrode PE and the planarization layer 180). For example, the non-conductive oxide film 266 may completely cover the substrate 110). In such an exemplary embodiment, the non-conductive oxide film 266 may overlap an entire portion or entirety of the substrate 110.

A part of the non-conductive oxide film 266 may be located between the pixel electrode PE and the light emitting element 512. For example, a part of the non-conductive oxide film 266 may be located between the pixel electrode PE and the light emitting element 512 in the light emission area 900.

Another part of the non-conductive oxide film 266 may be located between the light blocking layer 190 and the substrate 110. For example, one region or part of the non-conductive oxide film 266 may be located between the light blocking layer 190 and the pixel electrode PE and still another part or region of the non-conductive oxide film 266 may be located between the light blocking layer 190 and the planarization layer 180.

The non-conductive oxide film 266 may contact one surface (hereinafter, "a first surface") of surfaces of the light emitting element 512. In such an exemplary embodiment, the first surface of the light emitting element 512 faces the substrate 110, and the entire first surface of the light emitting element 512 may contact the non-conductive oxide film 266.

In an implementation, the non-conductive oxide film 266 may have a thickness that is less than a thickness of the light blocking layer 190. In an implementation, the thickness of the non-conductive oxide film 266 may be, e.g., about 0.5 nm to 10 nm. In an implementation, the thickness of the light blocking layer 190 may be, e.g., about 0.1 µm to 4 µm. In such an exemplary embodiment, each of the thickness of the non-conductive oxide film 266 and the thickness of the light blocking layer 190 refers to a thickness measured in a Z-axis direction in FIG. 5.

In an implementation, the thickness of the non-conductive oxide film 266 may be less than a thickness of the pixel electrode PE.

The non-conductive oxide film 266 may include an inorganic material or an organic material. In an implementation, when the non-conductive oxide film 266 includes an inorganic material, the non-conductive oxide film 266 may include, e.g., a silicon oxide (e.g., $SiO_x$), an aluminum oxide (e.g., $Al_2O_x$), $MoO_3$, or WO. In an implementation, when the non-conductive oxide film 266 includes an organic material, the non-conductive oxide film 266 may include, e.g., a siloxane.

When the non-conductive oxide film 266 includes or is formed of an aluminum oxide (e.g., $Al_2O_x$), described above, the non-conductive oxide film 266 may have a thickness in a range from, e.g., about 1.0 nm to about 1.4 nm.

The non-conductive oxide film 266 may help increase an electron-hole recombination rate in the light emitting element 512 by controlling an amount of holes injected into the light emitting element 512.

In an implementation, as illustrated in FIG. 5, an interface between the pixel electrode PE and the non-conductive oxide film 266 may have a planar shape. For example, each of facing surfaces between the pixel electrode PE and the non-conductive oxide film 266 may have a planar shape.

As illustrated in FIG. 5, the light blocking layer 190 may be located on the pixel electrode PE, the planarization layer 180, and the non-conductive oxide film 266. The light blocking layer 190 may have an opening that passes through the light blocking layer 190. The opening may correspond to the light emission area 900 of the substrate 110 or the pixel PX.

As illustrated in FIGS. 3 and 4G, the light emission area 900 may have a rhombic shape. In an implementation, the light emission area 900 may have various shapes, e.g., a quadrangular shape, besides the rhombic shape. A size of the light emission area 900 may be less than a size of the pixel electrode PE described above. At least a part of the pixel electrode PE may be located at the light emission area 900. In such an exemplary embodiment, an entire portion of the light emission area 900 may overlap the pixel electrode PE.

The light blocking layer 190 may include, e.g., a resin such as a polyacrylate resin or a polyimide resin.

The light emitting element 512 may be located on the pixel electrode PE in the light emission area 900, and the common electrode 613 may be located on the light blocking layer 190 and the light emitting element 512. The pixel electrode PE, the light emitting element 512, and the common electrode 613 constitute an LED, and in such an exemplary embodiment, the pixel electrode PE corresponds to an anode electrode of the LED and the common electrode 613 corresponds to a cathode electrode of the LED.

The light emitting element 512 may include, e.g., at least one of a hole injection layer (HIL) 661 and a hole transport layer (HTL) 662, at least one of an electron transport layer (ETL) 664 and an electron injection layer (EIL) 665, and a light emitting layer 663.

At least one of the hole injection layer 661 and the hole transport layer 662, at least one of the electron transport layer 664 and the electron injection layer 665, and the light emitting layer 633 may be disposed along the Z-axis direction between the non-conductive oxide film 266 and the common electrode 613.

At least one of the hole injection layer 661 and the hole transport layer 662 may be located between the non-conductive oxide film 266 and the light emitting layer 663. In such an exemplary embodiment, the hole injection layer 661 may be located between the non-conductive oxide film 266 and the hole transport layer 662, and the hole transport layer 662 may be located between the hole injection layer 661 and the light emitting layer 663.

At least one of the electron transport layer 664 and the electron injection layer 665 may be located between the light emitting layer 663 and the common electrode 613. For example, the electron transport layer 664 may be located between the light emitting layer 663 and the electron injection layer 665, and the electron injection layer 665 may be located between the electron transport layer 664 and the common electrode 613.

The light emitting layer 663 may be an organic light emitting layer including a low molecular organic material or a high molecular organic material.

In an implementation, the hole injection layer 661, the hole transport layer 662, the electron transport layer 664, and the electron injection layer 665 of adjacent pixels may be connected to each other. For example, the hole injection layers 661 of adjacent pixels may be formed unitarily, the hole transport layers 662 of adjacent pixels may be formed unitarily, the electron transport layers 664 of adjacent pixels may be formed unitarily, and the electron injection layers 665 of adjacent pixels may be formed unitarily. In such an exemplary embodiment, the hole injection layer 661, the hole transport layer 662, the electron transport layer 664, and the electron injection layer 665 are also located on the light blocking layer 190 as well as the light emission area. For example, the hole injection layer 661, the hole transport layer 662, the electron transport layer 664, and the electron injection layer 665 may be located between the light blocking layer 190 and the common electrode 613.

The pixel electrode PE and the common electrode 613 may be formed as one of a transmissive electrode, a transflective electrode, and a reflective electrode.

Transparent conductive oxide ("TCO") may be used to form a transmissive electrode. The TCO may include, e.g., indium tin oxide (ITO), indium zinc oxide (IZO), antimony tin oxide (ATO), aluminum zinc oxide (AZO), zinc oxide (ZnO), or mixtures thereof.

In order to improve bonding strength between the pixel electrode PE and the non-conductive oxide film 266, the pixel electrode PE may include indium tin oxide having a large surface roughness.

When the pixel electrode PE includes multiple layers, at least one of the multiple layers contacting the non-conductive oxide film 266 may include indium tin oxide.

The transflective electrode and the reflective electrode may include a metal, e.g., magnesium (Mg), silver (Ag), gold (Au), calcium (Ca), lithium (Li), chromium (Cr), aluminum (Al) and copper (Cu), or an alloy thereof. In such an exemplary embodiment, whether an electrode is a transflective type or a reflective type depends on the thickness of the electrode. In an implementation, the transflective electrode may have a thickness of about 200 nm or less and the reflective electrode may have a thickness of about 300 nm or more. As the thickness of the transflective electrode decreases, light transmittance and resistance increase. On the contrary, as the thickness of the transflective electrode increases, light transmittance decreases.

In addition, the transflective electrode and the reflective electrode may have a multilayer structure which includes a metal layer including a metal or a metal alloy, and a TCO layer stacked on the metal layer.

The sealing member 750 may be located on the common electrode 613. The sealing member 750 may include a transparent insulating substrate including glass, transparent plastic, or the like. In addition, the sealing member 750 may be formed to have a thin film encapsulation structure in which one or more inorganic layers and one or more organic layers are alternately stacked along the Z-axis direction.

Figure 7:
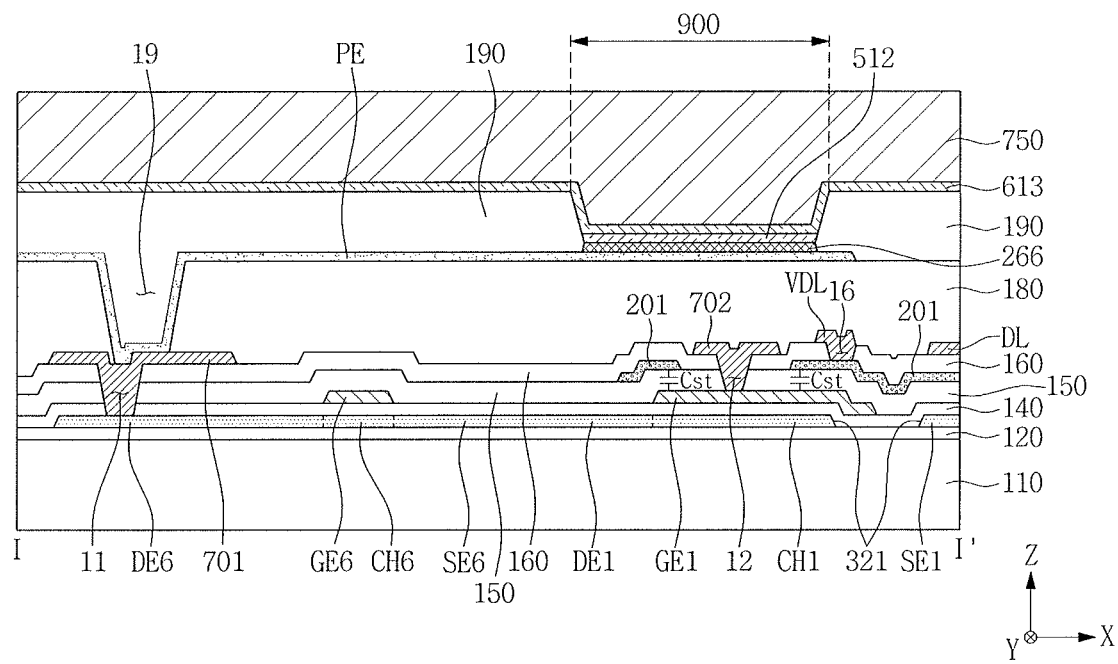
FIG. 7 illustrates a cross-sectional view taken along the line I-I' of FIG. 3 according to another exemplary embodiment.

FIG. 7 illustrates a cross-sectional view taken along the line I-I' of FIG. 3 according to another exemplary embodiment. For example, FIG. 7 is a cross-sectional view taken along the line I-I' of FIG. 3 when the non-conductive oxide film 266 of FIG. 3 has a substantially identical shape and a substantially equal size as those of the light emitting element 512 of FIG. 3 and overlaps the entirety of the light emitting element 512.

As illustrated in FIG. 7, the non-conductive oxide film 266 may have a substantially identical shape and a substantially equal size as those of the light emitting element 512 (e.g., the non-conductive oxide film 266 may be congruent with the light emitting element 512 or outer edges of the non-conductive oxide film 266 may be aligned with outer edges of the light emitting element 512). In such an exemplary embodiment, the non-conductive oxide film 266 may overlap the entirety of the light emitting element 512. For example, the non-conductive oxide film 266 and the light emitting element 512 may be disposed at a substantially same position on an X-Y plane of a substrate 110. In such an exemplary embodiment, the X-Y plane refers to a plane defined by an X-axis and a Y-axis.

In an implementation, an edge of the non-conductive oxide film 266 of FIG. 7 may be overlapped by the light blocking layer 190.

In addition, as described hereinabove, a hole injection layer 661, a hole transport layer 662, an electron transport layer 664 and an electron injection layer 665 of the light emitting element 512 may be further disposed on the light blocking layer 190 in addition to being disposed at a light emission area 900. For example, the hole injection layer 661, the hole transport layer 662, the electron transport layer 664, and the electron injection layer 665 may be further disposed between a light blocking layer 190 and a common electrode 613. In such an exemplary embodiment, the non-conductive oxide film 266 of FIG. 7 may have a substantially identical shape and a substantially equal size as those of the light emitting element 512 in the light emission area 900 and a light emitting layer 663 of the light emitting element 512, and overlaps the entirety of the light emitting element 512 in the light emission area 900.

As illustrated in FIG. 7, an interface between the pixel electrode PE and the non-conductive oxide film 266 may have a planar shape. For example, each of facing surfaces between the pixel electrode PE and the non-conductive oxide film 266 may each have a planar shape.

In an implementation, each of the non-conductive oxide film 266 and the light blocking layer 190 may include an inorganic material. In such an exemplary embodiment, the non-conductive oxide film 266 may be located to overlap an entire surface of the substrate 110.

In a light emitting display device according to another exemplary embodiment, each of the non-conductive oxide film 266 and the light blocking layer 190 may include an inorganic material. In such an exemplary embodiment, the non-conductive oxide film 266 may be located in a selective manner only at the light emission area 900, as illustrated in FIG. 7.

In addition, in a light emitting display device according to still another exemplary embodiment, the non-conductive oxide film 266 may include an inorganic material and the light blocking layer 190 may include an organic material. In such an exemplary embodiment, the non-conductive oxide film 266 may be located to overlap an entire surface of the substrate 110, as illustrated in FIG. 5.

In addition, in a light emitting display device according to yet another exemplary embodiment, the non-conductive oxide film 266 may include an inorganic material and the light blocking layer 190 may include an organic material. In such an exemplary embodiment, the non-conductive oxide film 266 may be located in a selective manner only at the light emission area 900, as illustrated in FIG. 7.

In addition, in a light emitting display device according to still yet another exemplary embodiment, the non-conductive oxide film 266 may include an organic material and the light blocking layer 190 may include an organic material. In such an exemplary embodiment, the non-conductive oxide film 266 may be located in a selective manner only at the light emission area 900, as illustrated in FIG. 7.

In an exemplary embodiment, when the light blocking layer 190 includes an organic material, an organic outgas could be generated. For example, heat generated by ultraviolet rays from sunlight or heat generated by continuous driving of the light emitting display device may be applied to the light blocking layer 190. When the light blocking layer 190 includes an organic material, an outgas could be generated from the light blocking layer 190. This outgas could damages the light emitting element 512, and defects such as pixel shrinkage could thus occur. Accordingly, when the light blocking layer 190 includes an inorganic material, such generation of the outgas may be substantially prevented.

Figure 8:
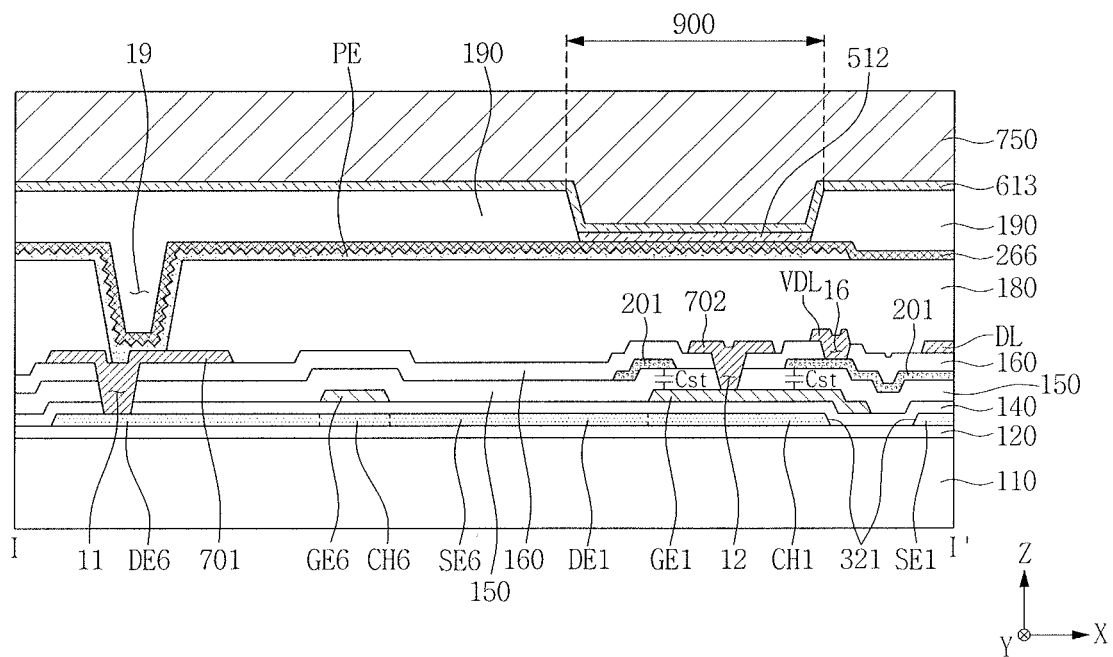
FIG. 8 illustrates a cross-sectional view taken along the line I-I' of FIG. 3 according to still another exemplary embodiment.

FIG. 8 illustrates a cross-sectional view taken along the line I-I' of FIG. 3 according to still another exemplary embodiment.

As illustrated in FIG. 8, an interface between a pixel electrode PE and a non-conductive oxide film 266 may have a concavo-convex shape. For example, each of facing surfaces between the pixel electrode PE and the non-conductive oxide film 266 may have a concavo-convex shape (e.g., the interface may have a sawtooth shape or a series of interengaging complementary peaks and valleys).

In an implementation, a cross-section of a concave portion and a cross-section of a convex portion of the interface (or facing surfaces) may have a triangular shape. In an implementation, each of the cross-section of the concave portion and the cross-section of the convex portion of the interface may have a quadrangular shape. In an implementation, each of the cross-section of the concave portion and the cross-section of the convex portion may have a hemispherical shape.

As the above-described interface has the concavo-convex shape, bonding strength between the pixel electrode PE and the non-conductive oxide film 266 may be further improved.

In an implementation, an interface between the pixel electrode PE and the non-conductive oxide film 266 illustrated in FIG. 7 may have a concavo-convex shape.

FIGS. 9A, 9B, 9C, 9D, and 9E illustrate cross-sectional views of stages in a process of manufacturing a light emitting display device according to an exemplary embodiment.

Figure 9A:
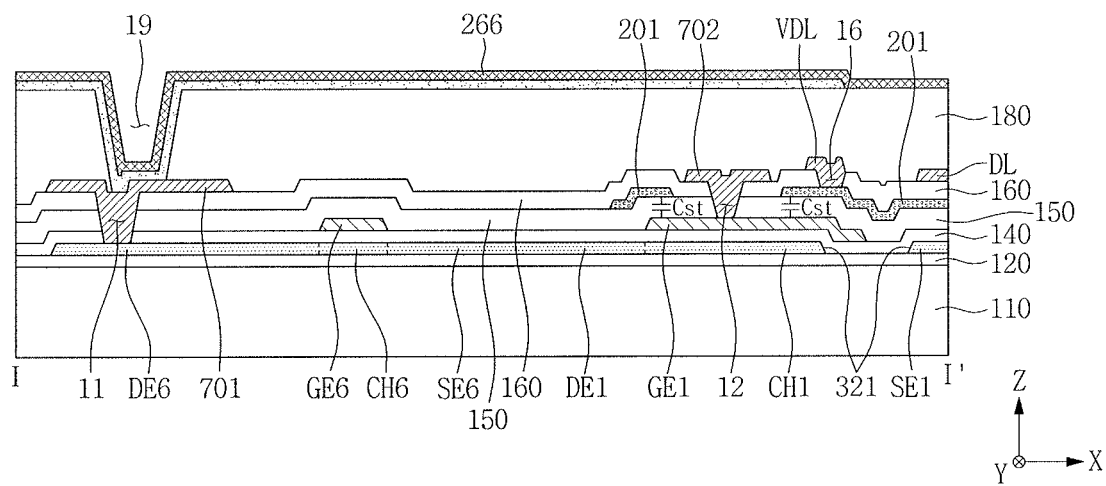
FIGS. 9A, 9B, 9C, 9D, and 9E illustrate cross-sectional views of stages in a process of manufacturing a light emitting display device according to an exemplary embodiment.

First, as illustrated in FIG. 9A, a structure including a substrate 110, a buffer layer 120, a semiconductor layer 321, a gate insulating layer 140, a first gate electrode GE1, a second gate electrode GE2, a third gate electrode GE3, a fourth gate electrode GE4, a fifth gate electrode GE5, a sixth gate electrode GE6, a seventh gate electrode GE7, an (n−1)-th scan line SLn−1, an n-th scan line SLn, an (n+1)-th scan line SLn+1, an emission control line EL, a first insulating interlayer 150, an initialization line IL, a capacitor electrode 210, a second insulating interlayer 160, a first connection electrode 701, a second connection electrode 702, a third connection electrode 703, a data line DL, a high potential line VDL, a planarization layer 180, and a pixel electrode PE may be prepared.

Next, the non-conductive oxide film 266 is formed on the structure. The non-conductive oxide film 266 may be located on the pixel electrode PE and the planarization layer 180 of the structure. In such an exemplary embodiment, the non-conductive oxide film 266 may be formed on the structure so as to overlap an entire surface of the substrate 110.

The non-conductive oxide film 266 may include or be formed of, e.g., a siloxane, which is an organic material described above. As a specific example of the process, after siloxane is applied (or coated) on the aforementioned structure, the applied siloxane may be cured by a soft bake process. The cured siloxane corresponds to the non-conductive oxide film 266. In such an exemplary embodiment, a thickness of the non-conductive oxide film 266 may be adjusted depending on a temperature of the soft bake process. For example, when siloxane, an organic material, is used as a material for the non-conductive oxide film 266, the thickness of the non-conductive oxide film 266 may be adjusted by the temperature of the soft bake process. The higher the temperature of the soft bake process, the thicker the non-conductive oxide film 266 may become.

In an implementation, when the non-conductive oxide film 266 includes or is formed of an aluminum oxide (e.g., $Al_2O_x$), which is an inorganic material, the thickness of the non-conductive oxide film 266 may be adjusted depending on a time during which the inorganic material is applied. As the application time becomes longer, the thickness of the non-conductive oxide film 266 becomes thicker.

Figure 9B:
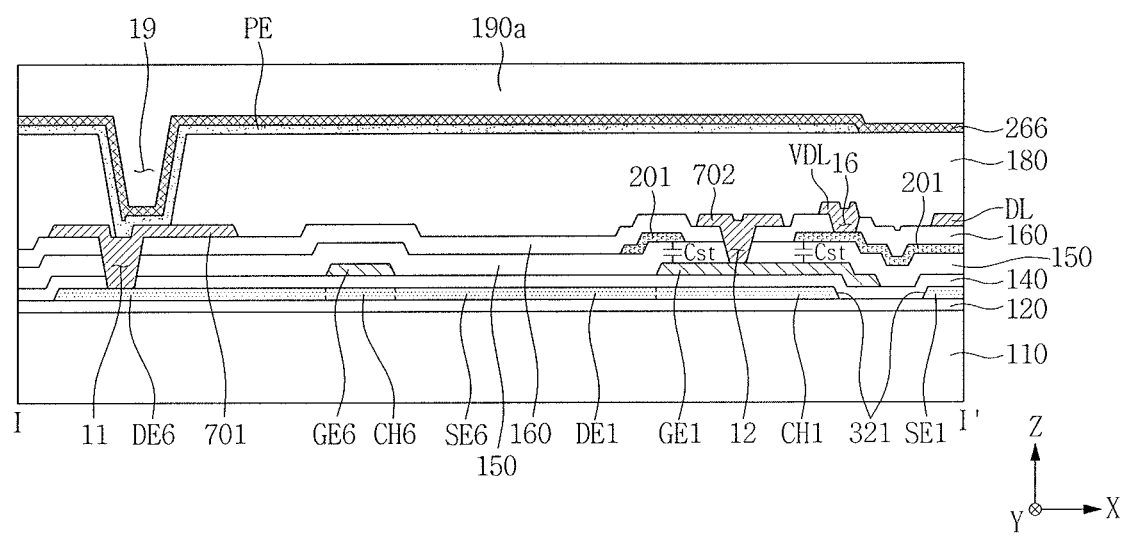

Thereafter, as illustrated in FIG. 9B, an insulating layer 190a may be formed on the structure of FIG. 9A described above. The insulating layer 190a may be located on the non-conductive oxide film 266. In such an exemplary embodiment, the insulating layer 190a may overlap an entire surface of the non-conductive oxide film 266. For example, the insulating layer 190a may also overlap an entire surface of the substrate 110 like the non-conductive oxide film 266.

The insulating layer 190a may include or be formed of a material included in the aforementioned light blocking layer 190.

Figure 9C:
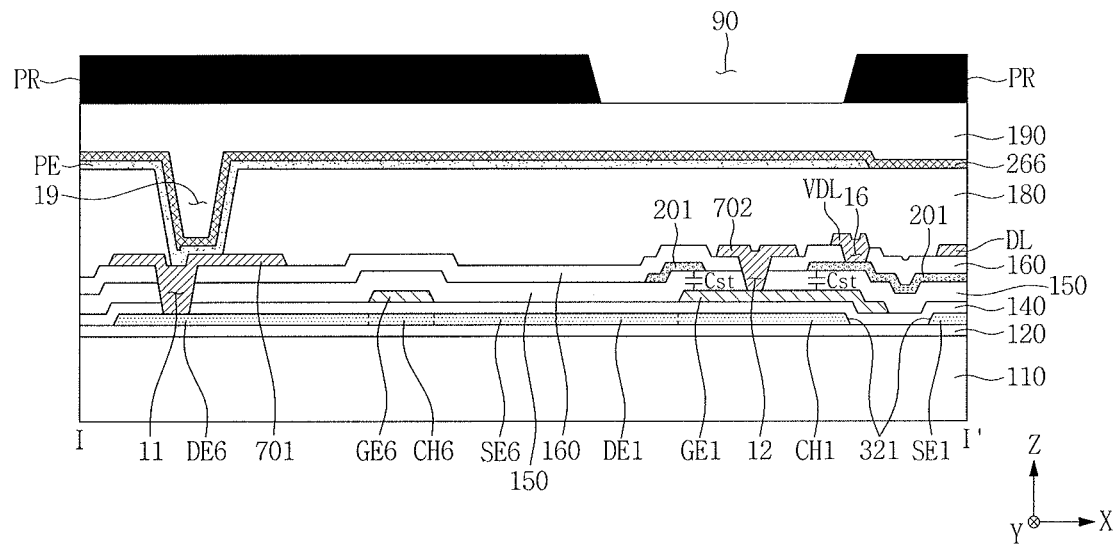

Next, as illustrated in FIG. 9C, a photoresist pattern PR may be formed on the structure of FIG. 9B described above. The photoresist pattern PR may be located on the insulating layer 190a.

The photoresist pattern PR may be formed by a photolithography process.

An opening 90 defined by the photoresist pattern PR may correspond to the aforementioned light emission area 900. A portion of the insulating layer 190a may be exposed through the opening 90 of the photoresist pattern PR.

Figure 9D:
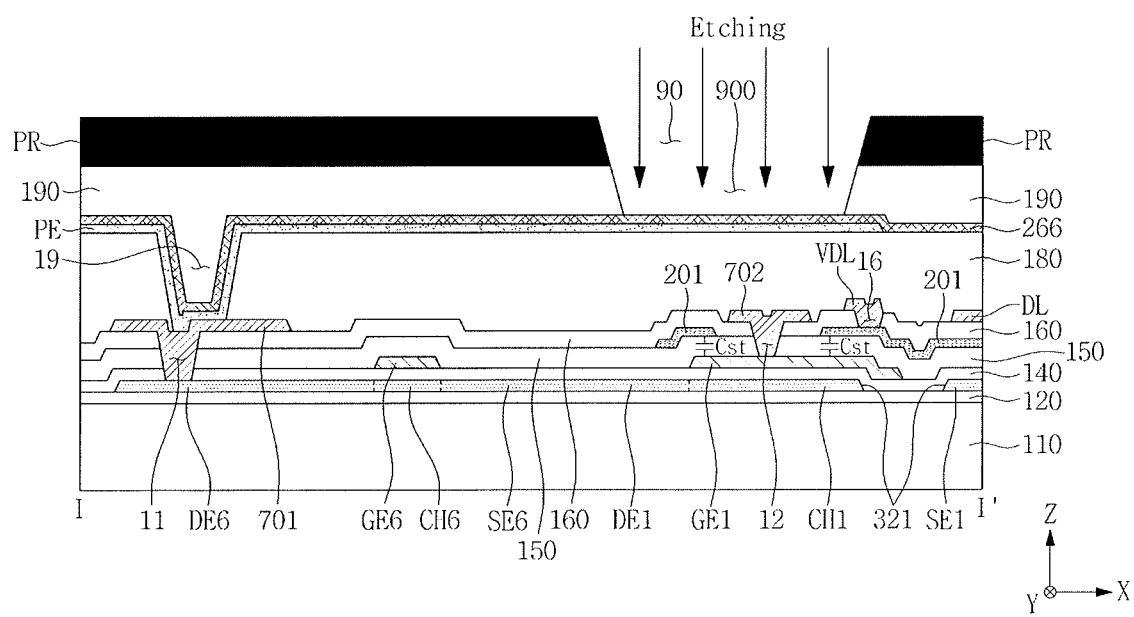

Thereafter, when an etching process is performed by using the photoresist pattern PR as a mask, a portion of the insulating layer 190a exposed through the opening 90 may be removed, as illustrated in FIG. 9D. In an implementation, the insulating layer 190a may be removed by dry etching.

The insulating layer 190a that is patterned by the etching process as illustrated in FIG. 9D may be the light blocking layer 190. A part of the non-conductive oxide film 266 may be exposed at the light emission area 900 defined by the light blocking layer 190.

Figure 9E:
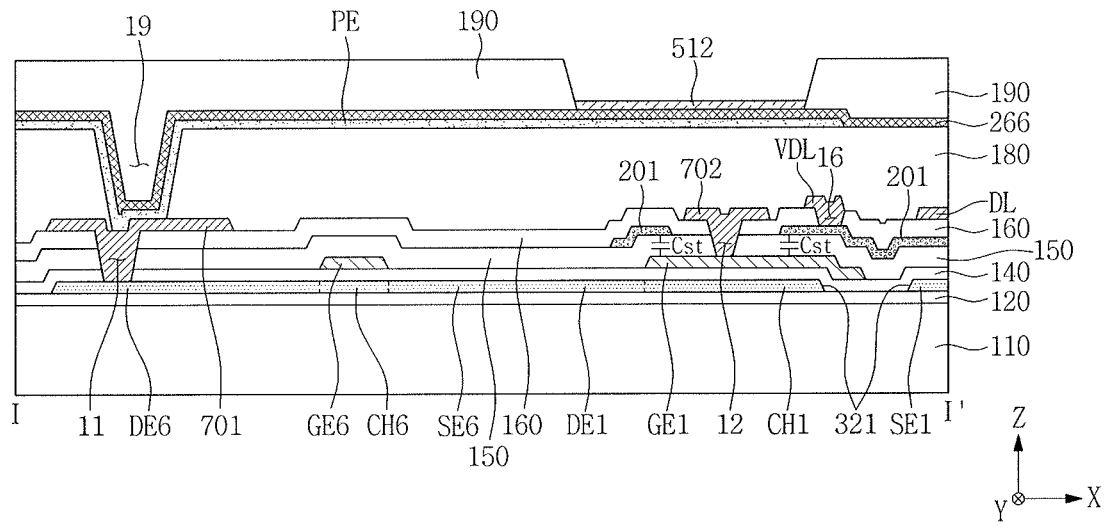

Then, as illustrated in FIG. 9E, the photoresist pattern PR may be removed. Thereafter, a light emitting element 512 may be formed at the light emission area 900. The light emitting element 512 of the light emission area 900 may be located on the non-conductive oxide film 266.

Next, a common electrode 613 and a sealing member 750 may be sequentially formed on the structure of FIG. 9E, such that the light emitting display device as in FIG. 5 is manufactured.

In an implementation, a light emitting display having the structure illustrated in FIG. 7 may be manufactured by the following method. For example, after the process of FIG. 9A described above, a patterning process may be performed on the non-conductive oxide film 266. The patterning process may include a photolithography process. By this patterning process, the non-conductive oxide film 266 may be patterned to be located only at the light emission area 900 as illustrated in FIG. 7. Thereafter, the light emitting display as in FIG. 7 may be completed through the processes shown in FIGS. 9B through 9E.

Figure 10A:
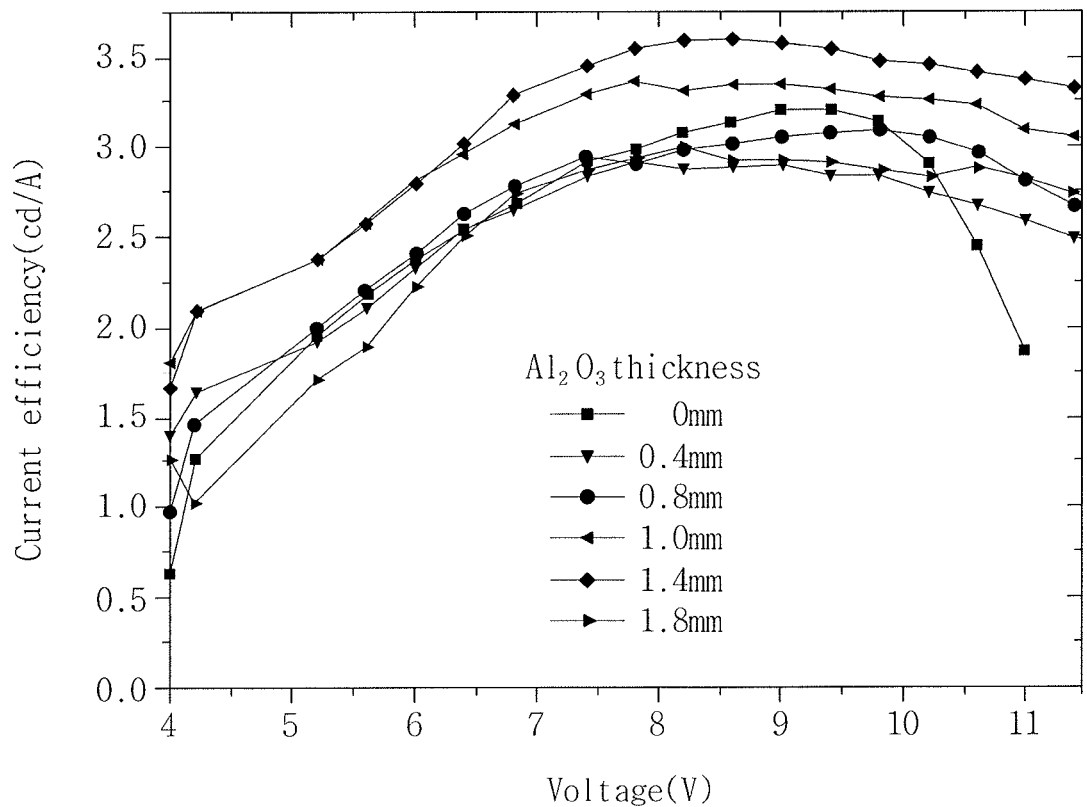
FIG. 10A illustrates a graph showing a current efficiency based on a voltage of a light emitting element depending on a thickness of a non-conductive oxide film.
Figure 10B:
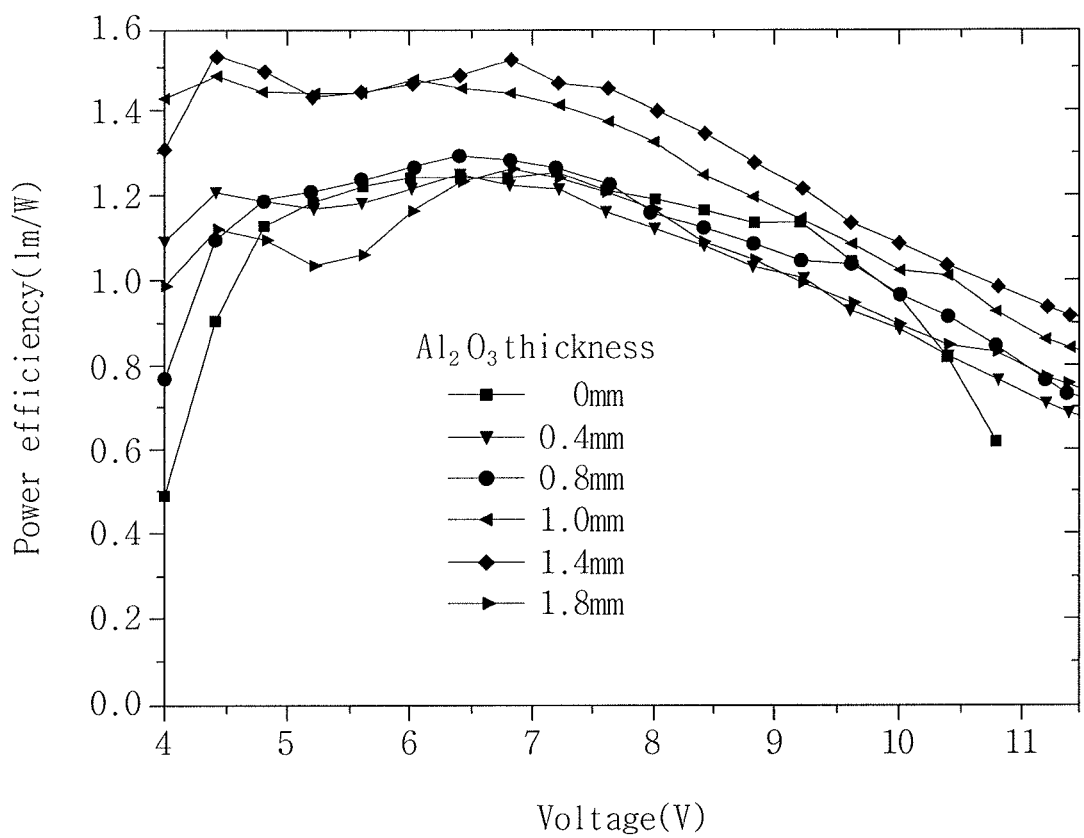
FIG. 10B illustrates a graph showing a power efficiency based on a voltage of a light emitting element depending on a thickness of a non-conductive oxide film.

FIG. 10A illustrates a graph showing a current efficiency based on a voltage of a light emitting element depending on a thickness of a non-conductive oxide film, and FIG. 10B illustrates a graph showing a power efficiency based on a voltage of a light emitting element depending on a thickness of a non-conductive oxide film.

As illustrated in FIGS. 10A and 10B, when a thickness of the non-conductive oxide film 266 including or being formed of $Al_2O_3$ is about 1.0 nm or about 1.4 nm, a current efficiency based on a voltage of the light emitting element 512 and a power efficiency based on a voltage of the light emitting element 512 may be improved. Accordingly, luminous efficiency of the light emitting element 512 may be improved.

As set forth hereinabove, the light emitting display device and the method of manufacturing the light emitting display device according to one or more exemplary embodiments may provide the following effects.

First, a non-conductive oxide film may be located between a pixel electrode and a light emitting element, and an electron-hole recombination rate in the light emitting element may be improved. Therefore, luminous efficiency of the light emitting element may be increased.

Second, the light blocking layer may include or may be formed of an inorganic material, generation of an outgas may be substantially prevented.

The embodiments may provide a light emitting display device having a high luminous efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting display device, comprising:
   a substrate;
   a switching element on the substrate;
   a first electrode connected to the switching element through a contact hole;
   a second electrode on the first electrode;
   a light emitting element between the first electrode and the second electrode; and
   a non-conductive oxide film between the first electrode and the light emitting element, a portion of the non-conductive oxide film being disposed in the contact hole, wherein
   an interface between the first electrode and the non-conductive oxide film that is disposed in the contact hole has a concave-convex shape.

2. The light emitting display device as claimed in claim 1, wherein the non-conductive oxide film contacts an entire surface of the light emitting element that faces the substrate.

3. The light emitting display device as claimed in claim 1, further comprising a light blocking layer on the substrate, the light blocking layer defining a light emission area of the substrate.

4. The light emitting display device as claimed in claim 3, wherein the non-conductive oxide film is between the light blocking layer and the substrate.

5. A light emitting display device, comprising:
   a substrate;
   a switching element on the substrate;
   a first electrode connected to the switching element through a contact hole;
   a second electrode on the first electrode;
   a light emitting element between the first electrode and the second electrode;
   a non-conductive oxide film between the first electrode and the light emitting element, a portion of the non-conductive oxide film being disposed in the contact hole; and
   a light blocking layer on the substrate, the light blocking layer defining a light emission area of the substrate, wherein
   the non-conductive oxide film is between the light blocking layer and the substrate, and
   the non-conductive oxide film overlaps an entire surface of the substrate.

6. The light emitting display device as claimed in claim 3, wherein the non-conductive oxide film has a thickness that is less than a thickness of the light blocking layer.

7. The light emitting display device as claimed in claim 6, wherein the thickness of the non-conductive oxide film is 0.5 nm to 10 nm.

8. The light emitting display device as claimed in claim 6, wherein the thickness of the light blocking layer is 0.1 μm to 4 μm.

9. The light emitting display device as claimed in claim 1, wherein the non-conductive oxide film has a thickness that is less than a thickness of the first electrode.

10. The light emitting display device as claimed in claim 1, wherein the non-conductive oxide film includes a silicon oxide, an aluminum oxide, a molybdenum oxide, a tungsten oxide, or a siloxane.

11. A method of manufacturing a light emitting display device, the method comprising:
    forming a switching element on a substrate;
    forming a first electrode connected to the switching element through a contact hole;
    forming a non-conductive oxide film on the first electrode, a portion of the non-conductive oxide film being disposed in the contact hole;
    forming an insulating layer on the non-conductive oxide film;
    forming a photoresist pattern on the insulating layer;
    forming a light blocking layer such that the light blocking exposes a portion of the non-conductive oxide film by removing a portion of the insulating layer using the photoresist pattern as a mask;
    forming a light emitting element on the portion of the non-conductive oxide film exposed through the light blocking layer; and
    forming a second electrode on the light emitting element, wherein
    an interface between the first electrode and the non-conductive oxide film that is disposed in the contact hole has a concave-convex shape.

12. The method as claimed in claim 11, wherein the non-conductive oxide film contacts an entire surface of the light emitting element that faces the substrate.

13. The method as claimed in claim 11, wherein the non-conductive oxide film overlaps an entire surface of the substrate.

14. The method as claimed in claim 11, wherein the non-conductive oxide film has a thickness that is less than a thickness of the light blocking layer.

15. The method as claimed in claim 11, wherein the non-conductive oxide film includes a silicon oxide, an aluminum oxide, a molybdenum oxide, a tungsten oxide, or a siloxane.

16. The method as claimed in claim 11, wherein:
    the non-conductive oxide film has a thickness of 0.5 nm to 10 nm, and
    the light blocking layer has a thickness of 0.1 μm to 4 μm.

17. A light emitting display device, comprising:
   a substrate;
   a switching element on the substrate;
   a first electrode connected to the switching element;
   a second electrode on the first electrode;
   a light emitting element between the first electrode and the second electrode; and
   a non-conductive oxide film between the first electrode and the light emitting element, the non-conductive oxide film including:
      a first side facing the first electrode; and
      a second side facing the light emitting element, wherein the second side has different shape from the first side, and
      a length of the first side is greater than a length of the second side.

18. The light emitting display device as claimed in claim 17, wherein the first side has a concave-convex shape, and the second side has a planar shape.

* * * * *